United States Patent
Goel et al.

(10) Patent No.: US 10,267,857 B2
(45) Date of Patent: Apr. 23, 2019

(54) METHOD AND SYSTEM FOR FUNCTIONAL SAFETY VERIFICATION

(71) Applicant: TAIWAN SEMICONDUCTOR MANUFACTURING CO., LTD., Hsinchu (TW)

(72) Inventors: Sandeep Kumar Goel, Dublin, CA (US); Abhishek Koneru, Hsinchu (TW); Tri Ngo, San Jose, CA (US); Yun-Han Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 43 days.

(21) Appl. No.: 15/592,602

(22) Filed: May 11, 2017

(65) Prior Publication Data

US 2018/0149698 A1    May 31, 2018

Related U.S. Application Data

(60) Provisional application No. 62/426,784, filed on Nov. 28, 2016.

(51) Int. Cl.
  *G01R 31/3183* (2006.01)
  *G01R 31/3185* (2006.01)
  (Continued)

(52) U.S. Cl.
  CPC . *G01R 31/318342* (2013.01); *G01R 31/3177* (2013.01); *G01R 31/31813* (2013.01); *G01R 31/318525* (2013.01); *G06F 17/5045* (2013.01)

(58) Field of Classification Search
  CPC .......... G01R 31/31813; G01R 31/3177; G01R 31/318525; G01R 31/318547;
  (Continued)

(56) References Cited

U.S. PATENT DOCUMENTS

| | | | | |
|---|---|---|---|---|
| 2006/0236154 A1* | 10/2006 | Shigihara | .............. | G06F 11/263 714/25 |
| 2010/0306606 A1* | 12/2010 | Huang | ........... | G01R 31/318547 714/726 |
| 2017/0074932 A1* | 3/2017 | Kourfali | ............. | G06F 17/5027 |

OTHER PUBLICATIONS

Srinivas et al., Functional test generation for synchronous sequential circuits, IEEE trans on computer aided design of integrated circuits and systems, vol. 15, No. 7, pp. 831-843. (Year: 1996).*

(Continued)

*Primary Examiner* — Shelly A Chase
(74) *Attorney, Agent, or Firm* — McClure, Qualey & Rodack, LLP

(57) ABSTRACT

A system includes a memory and a processor. The processor is configured to execute computer program codes to perform operations below. A netlist of a functional unit is transformed to a first matrix. The netlist includes information associated with nodes and flip-flops. A first node is selected from the nodes according to the first matrix and a second matrix, to generate a fault list. The second matrix includes weighting values for the nodes. The first node is determined to be associated with a maximum number of the flip-flops. A fault injection is performed on the functional unit. The functional unit is analyzed according to the netlist and the fault list, to generate a first file. A safety mechanism unit is analyzed to generate a second file. A failure is detected according to the first file or a combination of the first file and the second file.

20 Claims, 13 Drawing Sheets

(51) Int. Cl.
*G01R 31/3181* (2006.01)
*G01R 31/3177* (2006.01)
*G06F 17/50* (2006.01)

(58) Field of Classification Search
CPC ............ G01R 31/2177; G01R 31/3172; G01R 31/318342; G06F 17/505; G06F 17/5045
See application file for complete search history.

(56) References Cited

OTHER PUBLICATIONS

Ren et al., An efficient VLSI circuit extraction algorithm for transistor level to gate level abstraction, IEEE, pp. 1 to 4. (Year: 2010).*

Huang et al., An efficient logic extraction algorithm using partitioning and circuits encoding, IEEE, pp. V-249-V-252. (Year: 2004).*

A. Benso, A. Bosio, S. Di Carlo and R. Mariani, "A Functional Verification based Fault Injection Environment," International Symposium on Defect and Fault-Tolerance in VLSI Systems (DFT 2007), Rome, 2007, pp. 114-122.

* cited by examiner

METHOD AND SYSTEM FOR FUNCTIONAL SAFETY VERIFICATION

RELATED APPLICATIONS

This application claims priority to U.S. Provisional Application Ser. No. 62/426,784, filed Nov. 28, 2016, which is herein incorporated by reference.

BACKGROUND

With developments of technology, various functional circuits are integrated on one or more chips, to form system-on-chip (SOC). Due to different applications or different operational environments, failures may be introduced to the functional circuits. On condition that the failures exist in the functional circuits, the functions of the functional circuits may change. Thus, functional safety verification for SOC is very critical.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
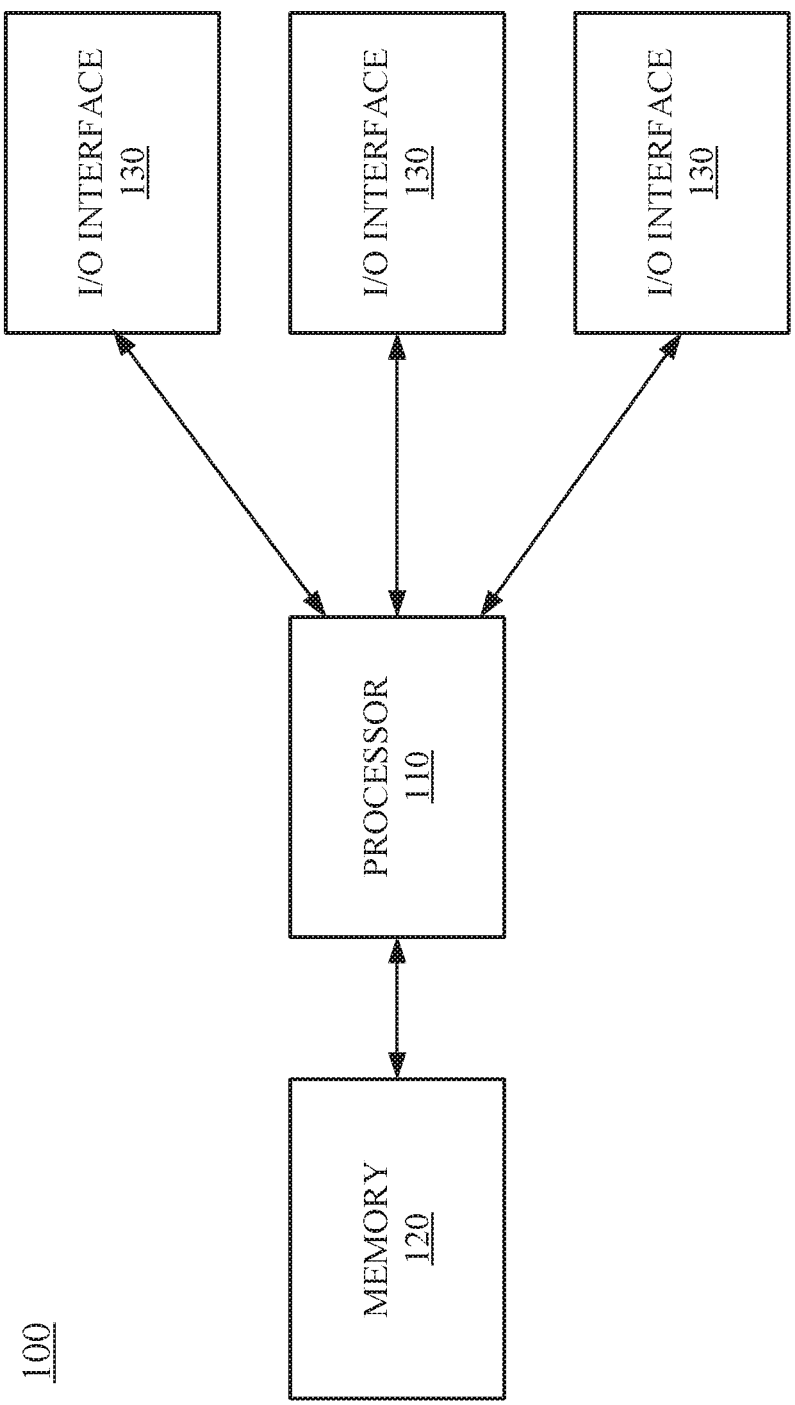
FIG. 1 is a schematic diagram of a system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Reference is now made to FIG. 1. FIG. 1 is a schematic diagram of a system 100, in accordance with some embodiments of the present disclosure. As illustratively shown in FIG. 1, the system 100 includes a processor 110, a memory 120 and Input/Output (I/O) interfaces 130. The processor 110 is coupled to the memory 120 and the I/O interfaces 130. In some embodiments, the system 100 is configured to verify a functional circuit.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, the processor 110 is a central processing unit (CPU), an application specific integrated circuit (ASIC), a multi-processor, a distributed processing system, or a suitable processing unit. Various circuits or units to implement the processor 110 are within the contemplated scope of the present disclosure.

In some embodiments, the memory 120 is a non-transitory computer readable storage medium encoded with storing a set of computer program codes for performing verification or other process. For illustration, the memory 120 stores computer program codes for performing operations including, for example, operations 310-360 illustrated in FIG. 3, operations 341-347 and 351 illustrated in FIG. 4, operations 511-513, 521-524, 531-532, and 541 illustrated in FIG. 5, operations 911-917, 921-923, 931-932 illustrated in FIG. 9, and operations 1102-1124 illustrated in FIG. 11. In some embodiments, the computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, an optical disk, a compact disk-read only memory (CD-ROM), a compact disk-read/write (CD-R/W), a digital video disc (DVD), a flash memory, and/or other media, now known or later developed, that are capable of storing code or data. Various circuits or units to implement the memory 120 are within the contemplated scope of the present disclosure.

The I/O interfaces 130 receive inputs or commands from various control devices which, for example, are operated by a circuit designer. Accordingly, the system 100 is able to be manipulated with the inputs or commands received from the I/O interfaces 130. In some embodiments, the I/O interfaces 130 include a display configured to display the status of executing the program code. In some embodiments, the I/O interfaces 130 include a graphical user interface (GUI). In some other embodiments, the I/O interfaces 130 include a keyboard, keypad, mouse, trackball, track-pad, touch screen, cursor direction keys, or the combination thereof, for communicating information and commands to processor 110.

The configurations of the system 100 are given for illustrative purposes only. Various configurations of the system 100 are within the contemplated scope of the present disclosure.

Figure 2:
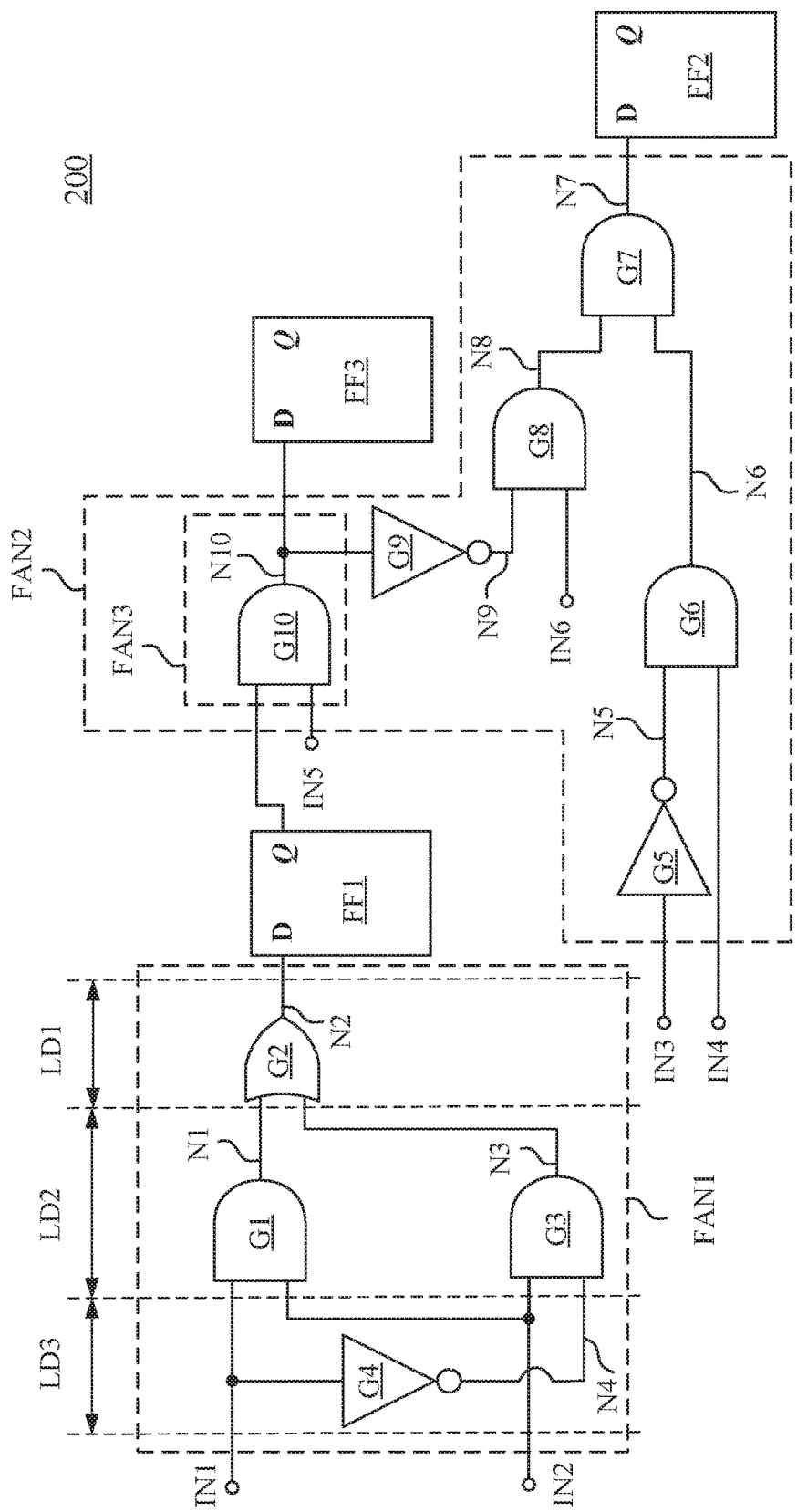
FIG. 2 is a schematic diagram illustrating a circuit configured to be verified by the system in FIG. 1, in accordance with some embodiments of the present disclosure.

Reference is now made to FIG. 2. FIG. 2 is a schematic diagram illustrating a circuit 200 configured to be verified by the system 100 in FIG. 1, in accordance with some embodiments of the present disclosure.

As illustratively shown in FIG. 2, the circuit 200 includes one or more logic gates and one or more state elements. In some embodiments, the state elements are flip-flops.

As illustratively shown in FIG. 2, the circuit 200 includes logic gates G1-G10. The logic gates G1, G3, G6-G8, and G10 are, for example, AND gates. The logic gate G2 is, for example, an OR gate. The logic gates G4-G5, and G9 are, for example, inverters. The circuit 200 further includes a flip-flop FF1, a flip-flop FF2, and a flip-flop FF3. A first input terminal of the logic gate G1 is configured to receive input data IN1, a second input terminal of the logic gate G1 is coupled to a first input terminal of the logic gate G3 to receive input data IN2, and an output terminal of the logic gate G1 is coupled to a first terminal of the logic gate G2. A second input terminal of the logic gate G2 is coupled to an output terminal of the logic gate G3, and an output terminal of the logic gate G2 is coupled to an input terminal of the flip-flop FF1. An input terminal of the logic gate G4 is coupled to the first input terminal of the logic gate G1 to receive the input data IN1, and an output terminal of the logic gate G4 is coupled to a second input terminal of the logic gate G3.

An input terminal of the logic gate G5 is configured to receive input data IN3, and an output terminal of the logic gate G5 is coupled to a first input terminal of the logic gate G6. A second input terminal of the logic gate G6 is configured to receive input data IN4, and an output terminal of the logic gate G6 is coupled to a first input terminal of the logic gate G7, a second input terminal of the logic gate G7 is coupled to an output terminal of the logic gate G8, and an output terminal of the logic gate G7 is coupled to an input terminal of the flip-flop FF2. A first input terminal of the logic gate G8 is configured to receive input data IN6, a second input terminal of the logic gate G8 is coupled to an output terminal of the logic gate G9, and an input terminal of the logic gate G9 is coupled to an output terminal of the logic gate G10.

A first input terminal of the logic gate G10 is coupled to an output terminal of the flip-flop FF1, a second input terminal of the logic gate G10 is configured to receive input data IN5, and an output terminal of the logic gate G10 is coupled to an input terminal of the flip-flop FF3.

In some embodiments, the circuit 200 is a sub functional circuit of a system-on-chip (SOC), and is without a primary output. In some embodiments, the term "primary output" is referred to a terminal or a pin that is configured to output a signal to a circuit external to the SOC. In some embodiments, outputs of the flip-flops FF1-FF3 are referred as pseudo primary outputs of the circuit 200. In some embodiments, the term "pseudo primary output" is referred to a terminal or a pin that is configured to output a signal which is able to be observed.

The configurations of the circuit 200 are given for illustrative purposes only. Various configurations of the circuit 200 are within the contemplated scope of the present disclosure.

Figure 3:
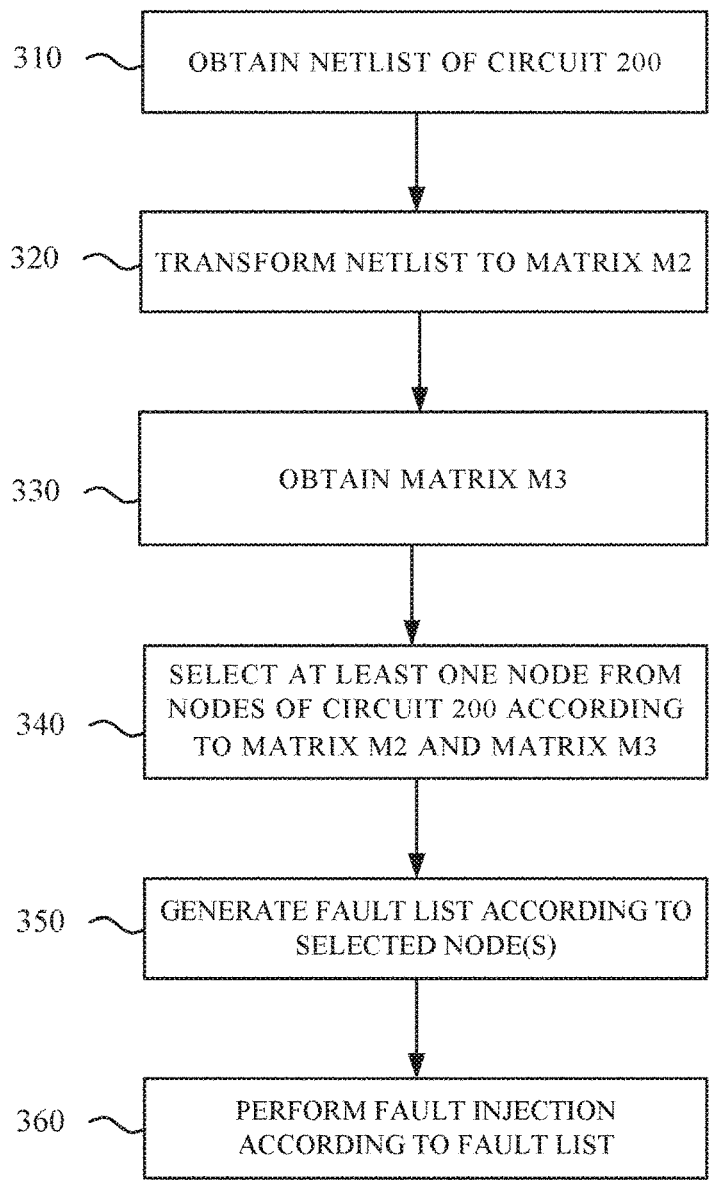
FIG. 3 is a flow chart of a method illustrating operations of the system in FIG. 1, in accordance with some embodiments of the present disclosure.

Reference is now made to FIG. 3. FIG. 3 is a flow chart of a method 300 illustrating operations of the system 100 in FIG. 1, in accordance with some embodiments of the present disclosure. For ease of understanding, the method 300 is discussed with reference to the system 100 shown in FIG. 1 and the circuit 200 shown in FIG. 2, but the present disclosure is not limited thereto.

In operation 310, a netlist of the circuit 200 is obtained. In some embodiments, the netlist is a gate-level netlist. In other words, the netlist of the circuit 200 is described with a predefined syntax that includes connections between the gates. In some embodiments, a circuit designer designs the circuit 200 by inputting commands to the I/O interfaces 130, and the processor 110 then generates the gate-level netlist of the circuit 200 according to the commands received by the I/O interfaces 130. In some embodiments, the gate-level netlist of the 200 is stored in the memory 120.

In operation 320, the processor 110 transforms the netlist of the circuit 200 to a matrix M2. In some embodiments, in operation 320, the logic gates G1-G10 of the circuit 200 are classified. As illustratively shown in FIG. 2, the logic gates G1-G10 are classified according to fan-in cones of the flip-flops FF1-FF3. In some embodiments, the term "fan-in cone" is referred to a range which includes at least one circuit which affects a flip-flop. For illustration, the states of the logic gates G1-G4 have much impact to the flip-flop FF1. Thus, the logic gates G1-G4 are classified to a fan-in cone FAN1 of the flip-flop FF1. For illustration, the states of the logic gates G5-G10 have much impact to the flip-flop FF2. Thus, the logic gates G5-G10 are classified to a fan-in cone FAN2 of the flip-flop FF2. For illustration, the state of the logic gate G10 has much impact to the flip-flop FF3. Thus, the logic gate G10 is classified to a fan-in cone FAN3 of the flip-flop FF3.

In some embodiments, a compiler is stored in the memory 120. The compiler is implemented in a form of software or firmware to compile the netlist having the predefined syntax. In some embodiments, the processor 110 executes the compiler to transform the netlist of the circuit 200 to a matrix M0 as shown below, according to the fan-in cones FAN1, FAN2, and FAN3. In some embodiments, the matrix M0 is a fan-in cone matrix of the circuit 200.

$$\begin{array}{c} FF1 \\ FF2 \\ FF3 \end{array} \begin{bmatrix} G1 & G2 & G3 & G4 & & & \\ G5 & G6 & G7 & G8 & G9 & G10 \\ G11 & & & & & \end{bmatrix} \quad (M0)$$

For illustration, as the circuit 200 includes three flip-flops FF1-FF3, the matrix M0 includes three rows. In a top-to-down sequence, rows of the matrix M0 are arranged with an order of the flip-flops FF1-FF3. Each row corresponds to one of the flip-flops FF1-FF3. As illustratively shown above, elements in the matrix M0 correspond to the logic gates G1-G10 respectively.

For illustration, as the logic gates G1-G4 are included in the fan-in cone FAN1 of the flip-flip FF1, the elements corresponding to the logic gates G1-G4 are assigned in a first row in the matrix M0. In addition, as the logic gates G5-G10 are included in the fan-in cone FAN2 of the flip-flip FF2, the elements corresponding to the logic gates G5-G10 are assigned in a second row in the matrix M0. Furthermore, as the logic gate G10 is included in the fan-in cone FAN3 of the flip-flip FF3, the element corresponding to the logic gate G10 is assigned in a third row in the matrix M0.

Then, the processor 110 transforms the matrix M0 to the matrix M1 as shown below. In some embodiments, the matrix M1 is a gate effect cone matrix of the circuit 200. For illustration, in a top-to-down sequence, the rows of the matrix M1 are arranged with an order of the logic gates G1-G10. In some embodiments, elements corresponding to flip-flops FF1-FF3 are assigned to rows of the matrix M1 according to the logic gates G1-G10.

$$\begin{array}{c} G1 \\ G2 \\ G3 \\ G4 \\ G5 \\ G6 \\ G7 \\ G8 \\ G9 \\ G10 \end{array} \begin{bmatrix} FF1 & \\ FF1 & \\ FF1 & \\ FF1 & \\ FF2 & \\ FF2 & \\ FF2 & \\ FF2 & \\ FF2 & \\ FF2 & FF3 \end{bmatrix} \quad (M1)$$

For illustration, as the circuit 200 includes ten logic gates G1-G10, the matrix M1 includes ten rows. Each row corresponds to one of the logic gates G1-G10. In the matrix M0, the elements corresponding to the logic gates G1-G4 correspond to the flip-flop FF1. Accordingly, in the matrix M1, the element corresponding to the flip-flop FF1 is assigned to a first row, a second row, a third row, and a fourth row of the matrix M1, to correspond to the logic gates G1-G4 respectively.

In addition, in the matrix M0, the elements corresponding to the logic gates G5-G10 correspond to the flip-flop FF2. Accordingly, in the matrix M1, the element corresponding to the flip-flop FF2 is assigned to a fifth row, a sixth row, a seventh row, an eighth row, a ninth row, and a tenth row of the matrix M1, to correspond to the logic gates G5-G10 respectively.

Furthermore, in the matrix M0, the element corresponding to the logic gate G10 corresponds to the flip-flop FF3. Accordingly, in the matrix M1, the element corresponding to the flip-flop FF3 is assigned to the tenth row, to correspond to the logic gate G10. As a result, the matrix M1 is generated.

Then, the processor 110 transforms the matrix M1 to a matrix M2 as shown below. For illustration, the matrix M1 is transformed to the matrix M2 by replacing the logic gates G1-G10 with nodes N1-N10. As illustratively shown in FIG. 2, the node N1 is the output terminal of the logic gate G1, the node N2 is the output terminal of the logic gate G2, and so on. In some embodiments, the matrix M2 is a node effect cone matrix of the circuit 200. For illustration, in a top-to-down sequence, the rows of the matrix M2 are arranged with an order of the nodes N1-N10.

$$\begin{array}{c} N1 \\ N2 \\ N3 \\ N4 \\ N5 \\ N6 \\ N7 \\ N8 \\ N9 \\ N10 \end{array} \begin{bmatrix} FF1 & \\ FF1 & \\ FF1 & \\ FF1 & \\ FF2 & \\ FF2 & \\ FF2 & \\ FF2 & \\ FF2 & \\ FF2 & FF3 \end{bmatrix} \quad (M2)$$

In operation 330, a matrix M3, as shown below, is obtained. In some embodiment, the processor 110 generates the matrix M3 according to the circuit 200. For illustration, the matrix M3 includes weighting values corresponding to the nodes N1-N10 of the circuit 200. For illustration, the circuit 200 includes ten logic gates G1-G10. Accordingly, the matrix M3 includes ten rows. Each row of the ten rows includes a weighting value corresponding to one of the nodes N1-N10. In some embodiments, the matrix M3 is a cost matrix of the circuit 200.

$$\begin{array}{c} N1 \\ N2 \\ N3 \\ N4 \\ N5 \\ N6 \\ N7 \\ N8 \\ N9 \\ N10 \end{array} \begin{bmatrix} 1 \\ 1 \\ 1 \\ 1 \\ 1 \\ 1 \\ 1 \\ 1 \\ 1 \\ 1 \end{bmatrix} \quad (M3)$$

In some embodiments, the weighting values of the matrix M3 are predetermined by the circuit designer. In some embodiments, the weighting values of the matrix M3 are assigned to be a predetermined value. For example, the weighting values of the matrix M3 are assigned to be 1, but the present disclosure is not limited thereto.

In some other embodiments, the weighting values of the matrix M3 are calculated by the processor 110 according to the design of the circuit 200. Related embodiments will be described in later paragraphs.

In operation 340, the processor 110 selects at least one node from the nodes N1-N10 of the circuit 200 according to the matrixes M2 and M3, to cover a maximum number of the flip-flops FF1-FF3. The selected nodes will affect the maximum number of the flip-flops FF1-FF3. In some embodiments, the processor 110 performs an algorithm to determine which node is to be selected. In some embodiments, the algorithm is a Greedy algorithm. The algorithm for determining the selected node is given for illustrative purposes only. Various algorithms for determining the selected node are within the contemplated scope of the present disclosure.

In operation 350, the processor 110 generates a fault list according to the selected node(s). For illustration, the processor 110 records the selected node(s) into a file including the fault list. In some embodiments, the file is stored in the memory 120.

In operation 360, the processor 110 performs a fault injection on the circuit 200 according to the fault list, in order to verify a functional safety of the circuit 200. For example, faults are virtually generated and injected to the selected nodes of the circuit 200 to verify the functional safety of the circuit 200.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of some embodiments of the present disclosure.

Figure 4:
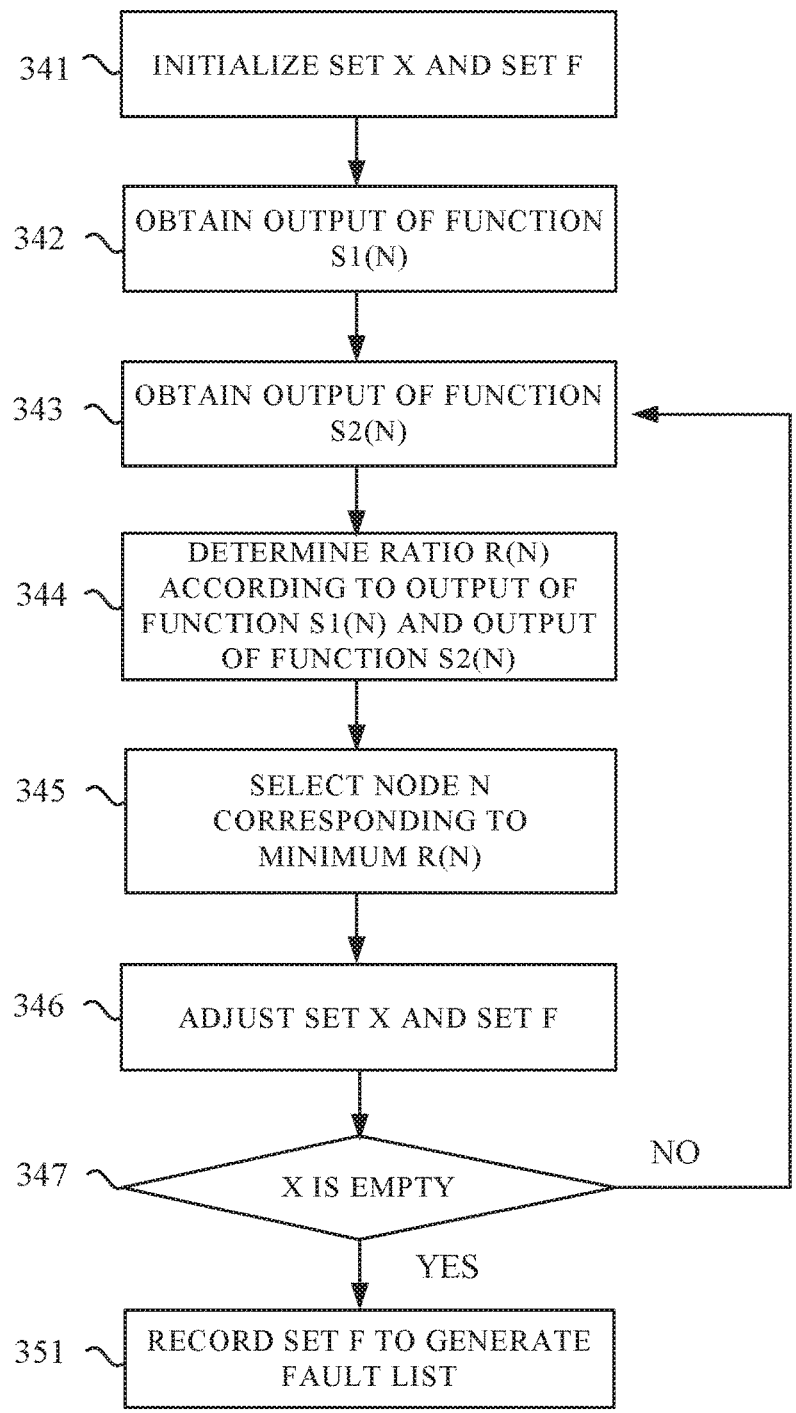
FIG. 4 is a flow chart illustrating detailed sub-operations of some operations of the method in FIG. 3, in accordance with some embodiments of the present disclosure.

Reference is now made to FIG. 4. FIG. 4 is a flow chart illustrating detailed sub-operations 341-347 of operation 340 and sub-operation 351 of operation 350 of the method 300 in FIG. 3, in accordance with some embodiments of the present disclosure.

As discussed above, in operation 340 of the method 300 in FIG. 3, the processor 110 selects at least one node according to the matrix M2 and a matrix M3.

In some embodiments, the processor 110 recursively calculates a ratio R(N) of an output of a function S1(N) to an output of a function S2(N) for the nodes N1-N10, to select the at least one node from the nodes N1-N10. N is an index value for the nodes N1-N10. The ratio R(N) is derived from the following equation (1):

$$R(N) = \frac{S1(N)}{S2(N)} = \frac{C(N)}{|X \cap FF(n)|} \quad (1)$$

In some embodiments, the output of the function S1(N) is a corresponding weighting value C(N), in the matrix M3, of a corresponding node N of the nodes N1-N10. In other words, the output of the function S1(N) is obtained by and associated with the matrix M3. For example, if N is N1, the corresponding weighting value C(N) is determined to be 1 according to the matrix M3. The output of the function S2(N) is a number that is determined according to an intersection of a dynamic set X and a dynamic set FF(N). The dynamic set FF(N) includes at least one flip-flop corresponding to the node N. In other words, the output of the function S2(N) is obtained by and associated with the matrix M2. For example, if N is N1, the dynamic set FF(N) is determined to be {FF1} according to the matrix M2. Alternatively, if N is N10, the dynamic set FF(N) is determined to be {FF2, FF3} according to the matrix M2.

In sub-operation 341, the processor 110 initializes the dynamic set X to cover all flip-flops FF1-FF3 of the circuit 200, and initializes a dynamic set F to be empty. For example, as the circuit 200 includes the flip-flops FF1-FF3, the dynamic set X is initialized to include the flip-flops FF1-FF3. In other words, under this condition, the dynamic set X is determined to be {FF1, FF2, FF3}.

In sub-operation 342, the output of the function S1(N) is obtained according to the matrix M3. For example, as defined in the matrix M3, the weighting value corresponding to the node N1 is 1. Accordingly, the output of the function S1(N1) is determined to be 1.

In sub-operation 343, the output of the function S2(N) is obtained according to the matrix M2. For example, as the X is initialized to include all flip-flops FF1-FF3 and the node N1 corresponds to the element corresponding to the flip-flop FF1 in the matrix M2, the intersection of the dynamic set X and the dynamic set FF(N1) includes only one element, i.e., the flip-flop FF1. It is able to be expressed as: X∩FF(N1)= {FF1, FF2, FF3}∩{FF1}={FF1}. Thus, the output of the function S2(N1) is 1.

In operation 344, the ratio R(N) is determined according to the output of the function S1(N) and the output of the function S2(N). For example, as the output of the function S1(N1) is 1 and the output of the function S2(N1) is 1, the ratio R(N1) is thus equal to 1. With the same analogy, the ratios R(N2), R(N3), R(N4), R(N5), R(N6), R(N7), R(N8), and R(N9) are determined to be 1. For the node N10, the output of the function S1(N10) is 1 as well, but the intersection of the dynamic set X and the dynamic set FF(N10) includes two elements, i.e., the flip-flops FF2 and FF3. Thus, the output of the function S2(N10) is 2. As a result, the ratio R(N10) is equal to 1/2.

In sub-operation 345, a node is selected from the nodes N1-N10, according to a minimum ratio of the ratios R(N1)-R(N10). For example, compared to the ratios R(N1)-R(N10), the ratio R(N10) has a minimum value 1/2. Thus, the node N10 is selected.

In sub-operation 346, the dynamic set X and the dynamic set F are adjusted according to the selected node N10. For example, the dynamic set X is adjusted to exclude the flip-flops corresponding to the node N10. For example, as the selected node N10 is corresponding to the flip-flops FF2 and FF3, the flip-flops FF2 and FF3 are excluded from the dynamic set X. In other words, the adjusted dynamic set X includes only one flip-flop FF1. In addition, the dynamic set F is adjusted to include the selected node N10.

In sub-operation 347, it is determined whether or not the dynamic set X is empty. In some embodiments, the determination is made by the processor 110, but the present disclosure is not limited thereto. If the dynamic set X is not empty, sub-operation 343 is performed again. In other words, on condition that the adjusted set X is not empty, the output of function S2(N) for nodes N1-N10 are calculated again according the matrix M2 and the adjusted set X.

In this example, as the adjusted dynamic set X includes only the flip-flop FF1, with operations discussed above, the outputs of the function S2(N1), the function S2(N2), the function S2(N3), and the function S2(N4) are determined to be 1. The outputs of the function S2(N5), the function S2(N6), the function S2(N7), the function S2(N8), the function S2(N9) and the function S2(N10) are determined to be 0.

Then, new ratios R(N) are determined in operation 344 according to new output of function S2(N). As a result, the ratios R(N1)-R(N4) are determined to be 1. The ratios R(N5)-R(N10) are determined to be infinity. In other words, the ratios R(N1)-R(N4) have minimum values among the ratios R(N1)-R(N10) and are equal to each other. In some embodiments, as the node N1 is prior to the nodes N2-N4 in the matrix M3, the node N1 is selected in sub-operation 335.

Then, the dynamic set X and the dynamic set F are adjusted according to the selected node N1. The dynamic set F is adjusted to further include the selected node N1. As a result, the adjusted dynamic set F includes the selected node N10 and the selected node N1.

In addition, the dynamic set X is further adjusted to exclude the flip-flop FF1 corresponding to the node N1. In other words, the adjusted dynamic set X includes no flip-flop. Then, it is determined again whether or not the dynamic set X is empty, in sub-operation 347.

In sub-operation 351, on condition that the dynamic set X is empty, the processor 110 records the dynamic set F, to generate the fault list. In some embodiments, the ratio R(N) is stopped from being further calculated on condition that the dynamic set X is empty. For example, as the dynamic set F includes the selected nodes N1 and N10, the processor 110 records the selected nodes N1 and N10 into the fault list.

Then, the processor 110 performs the fault injection to the selected nodes N1 and N10 of the circuit 200, in order to validate the robustness of the circuit 200 against failure. As the state of the selected node N10 has much impact to the flip-flops FF2 and FF3, and the state of the selected node N1 has much impact to the flip-flops FF1, the selected nodes N1 and N10 are determined to cover all flip-flops FF1-FF3 of the circuit 200. Effectively, the fault injections performed to the nodes N1 and N10 are sufficient to verify the robustness of the circuit 200.

Figure 5:
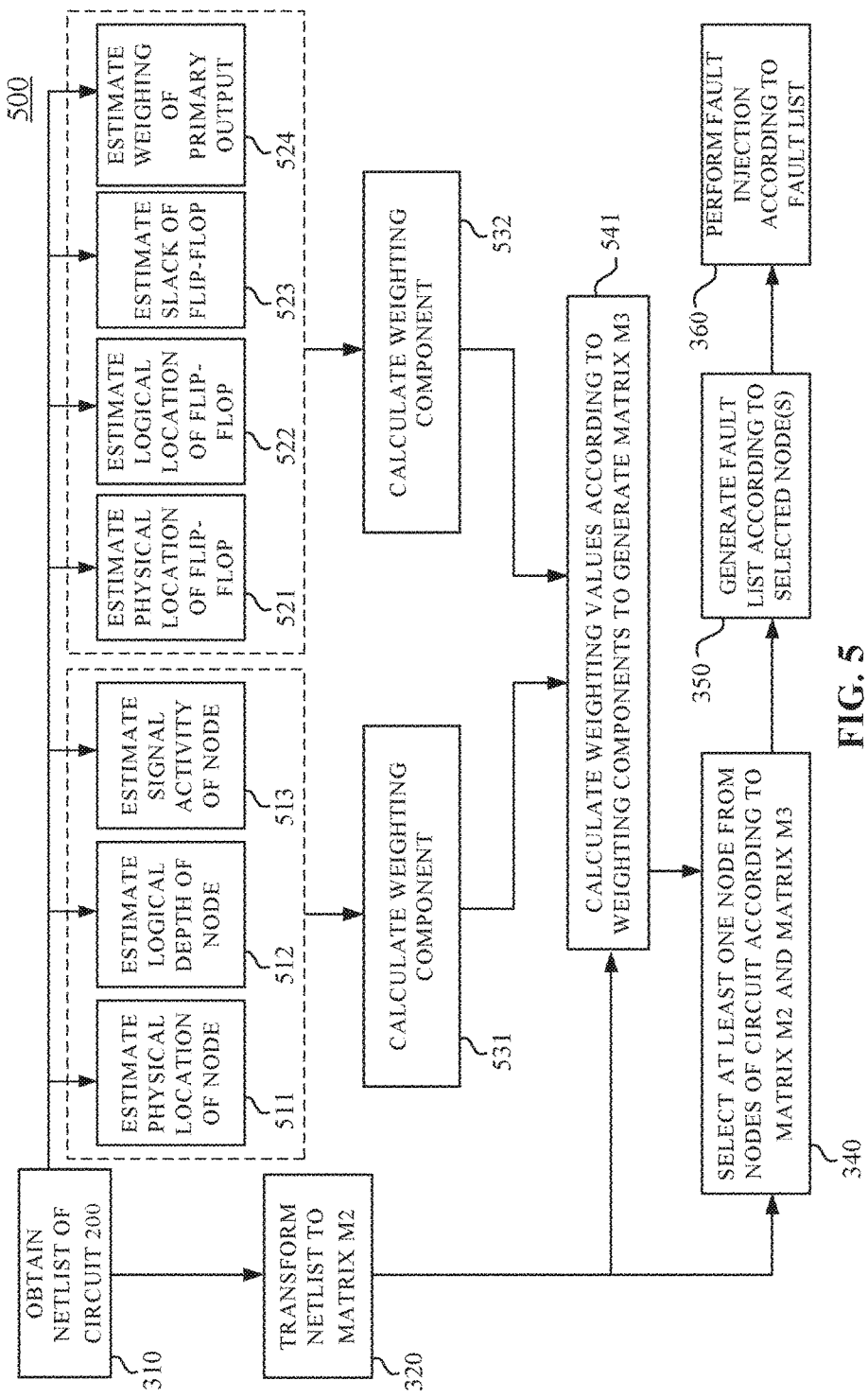
FIG. 5 is a flow chart of a method illustrating operations of the system in FIG. 1, in accordance with some embodiments of the present disclosure.

Reference is now made to FIG. 5. FIG. 5 is a flow chart of a method 500 illustrating operations of the system in FIG. 1, in accordance with some embodiments of the present disclosure. For ease of understanding, with respect to the embodiments of FIG. 5, like operations in FIG. 3 are designated with the same reference numbers. For illustration, the method 500 further includes operations 511-513, 521-524, 531-532, and 541.

In some embodiments, the weighting values in the matrix M3 are calculated by the processor 110 according to the netlist of the circuit 200. For illustration, according to the netlist of the circuit 200, some features corresponding to the nodes N1-N10 are estimated by the operations 511-513. In some embodiments, the features estimated by operations 511-513 are associated with the nodes N1-N10. Other features corresponding to the flip-flops FF1-FF3 and a primary output of the circuit 200 are estimated by the operations 521-524. In some embodiments, the features estimated by operations 521-524 are associated with the flip-flops FF1-FF3 and the primary output of the circuit 200. For ease of understanding, the following operations are described with the node N1 as an example. Other nodes N2-N10 have the similar operations.

In operation 511, a physical location of the node N1 is estimated. In some embodiments, the physical location of the node N1 indicates a physical distance from a center of the circuit 200 to the node N1. In some embodiments, nodes located closer to the center are more important than nodes located far away from the center. In some other embodiments, nodes located inside a functional module are more important than nodes located on the periphery of the circuit 200.

In operation 512, a logical depth of the node N1 is estimated. As illustratively shown in FIG. 2, for the fan-in cone FAN1, the node N2 is considered to be in a logical region LD1, the nodes N1 and N3 are considered to be in a logical region LD2, and the node N4 is considered to be in a logical region LD3. In logical view, the logical region LD1 is closest to the flip-flop FF1, and the logical region LD3 is most far away from the flip-flop FF1. Explained in a different way, as a signal transmitted from the node N2 to the flip-flop FF1 only passes through the logical region LD1, a logic depth of the node N2 is determined to 1. With the same analogy, logical depths of the nodes N1 and N3 are determined to be 2, and a logical depth of the node N4 is determined to be 3. In other words, the logical depth of the node N4 is deeper than the logical depth of the node N2. In some embodiments, nodes being closer, in logical view, to a flip-flop are more important than nodes being far away from the flip-flop.

In operation 513, a signal activity of the node N1 is estimated. For illustration, the signal activity of the node N1 indicates a probability that a signal at the node N1 changes, from logic value of 1 to logic value of 0 or from logic value of 0 to logic value of 1, per a clock cycle. In some embodiments, nodes having higher signal activity are more important than nodes having lower signal activity.

In operation 521, a physical location of the flip-flop FF1, which is associated with the node N1, is estimated. In some embodiments, the physical location of the flip-flop FF1 is corresponding to a distance from the center of the circuit 200 to the flip-flop FF1 in physical view.

Figure 6:
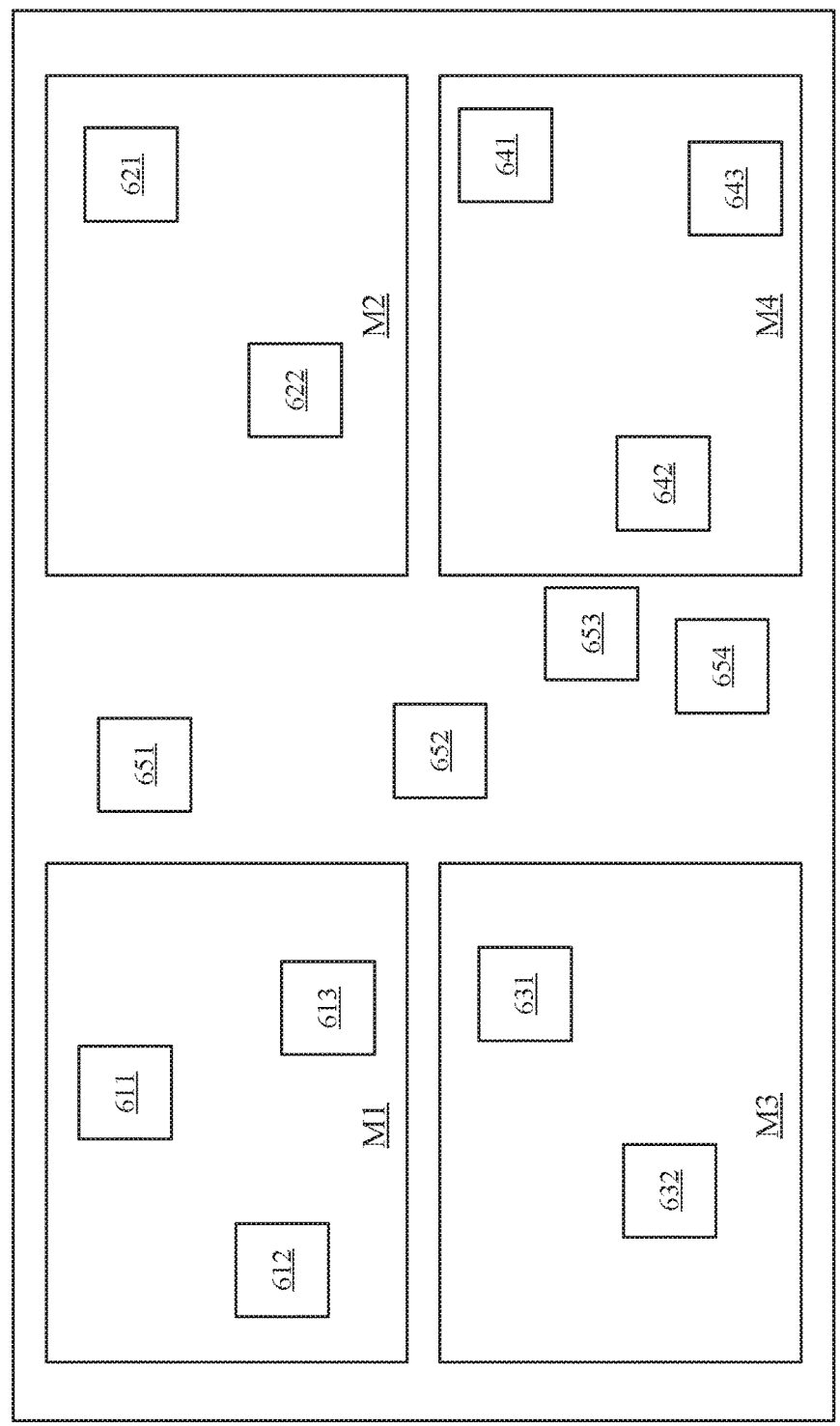
FIG. 6 is a schematic diagram illustrating a circuit design configured to be verified by the system in FIG. 1, in accordance with some embodiments of the present disclosure.

Reference is now made to FIG. 6. FIG. 6 is a schematic diagram illustrating a circuit design 600 configured to be verified by the system 100 in FIG. 1, in accordance with some embodiments of the present disclosure. As illustratively shown in FIG. 6, the circuit design 600 includes functional modules M1-M4. For ease of understanding, other elements are eliminated in FIG. 6.

For illustration, the functional module M1 includes flip-flops 611-613. The functional module M2 includes flip-flops 621-622. The functional module M3 includes flip-flops 631-632. The functional module M4 includes flip-flops 641-643. The circuit design 600 further includes flip-flops 651-654. As the flip-flops 651-654 are outside of the functional modules M1-M4, the flip-flops 651-654 are referred as interface flip-flops. In some other embodiments, flip-flops located inside a functional module are more important than flip-flops located at an interface of two functional modules. In other words, in some embodiments, the flip-flop 642 is more important than the flip-flop 654.

In some embodiments, relative distances between any two elements in FIG. 6 are illustrated according to physical relative distances between the two elements. In other words, a physical relative distance between the flip-flop 652 and a center of the circuit design 600 is smaller than a physical relative distance between the flip-flop 651 and the center of the circuit design 600. In some embodiments, flip-flops located closer to the center are more important than flip-flops located far away from the center. In other words, the flip-flop 652 is more important than the flip-flop 651.

With continued reference to FIG. 5, in operation 522, a logical location of the flip-flop FF1, which is associated with the node N1, is estimated. In some embodiments, flip-flops being closer to the primary output are more important than nodes being far away from the primary output.

In operation 523, a slack of the flip-flop FF1, which is associated with the node N1, is estimated. A slack of the flip-flop FF1 is time difference between a transition time of a clock signal and an arriving time of the clock signal. The time difference is from a path with maximum delay connected to the flip-flop FF1. In some embodiments, flip-flops located on timing critical paths are more important than flip-flops located on paths with sufficient slack.

In operation 524, a weighting of the primary output of the circuit 200 is estimated. As above-mentioned embodiments, the circuit 200 includes no primary output.

In operation 531, a weighting component is calculated according to the features estimated in operations 511-513. For illustration, the weighting component is associated with the node N1.

In operation 532, a weighting component is calculated according to the features estimated in operations 521-524. For illustration, the weighting component is associated with the flip-flop FF1 and the primary output of the circuit 200.

In operation 541, the weighting value corresponding to the node N1, in the matrix M3, is calculated according to the weighting components obtained in operations 531-532. In some embodiments, the weighting values are derived from the following equation (2):

$$C_i = c_1 NC_i + c_2 \Sigma_{\forall j: \in FF_j \in N_i} FC_j + c_3 \Sigma_{\forall k: FF_k \in N_i} d(N_i, FF_k) + c_4 \Sigma_{\forall l: PO_l \in N_i} d(N_i, PO_l) \quad (2)$$

where $C_i$ represents a reciprocal of a weighting value of a node $N_i$ and i is an index for nodes N1-N10. $c_1$, $c_2$, $c_3$, $c_4$ are predetermined parameters and are able to be adjusted. $NC_i$ is associated with the signal activity and the logical depth of the node $N_i$. $FC_j$ is associated with the slack of the flip-flops corresponding to the node $N_i$ and j is an index for the flip-flops corresponding to the node $N_i$. $d(N_i, FF_k)$ represents the logical distance and the physical distance between the node $N_i$ and the corresponding flip-flops $FF_k$, and j is an index for the flip-flops corresponding to the node $N_i$. $d(N_i, PO_l)$ represents the distance between the node $N_i$ and the primary output of the circuit 200.

In some embodiments, $NC_i$ of the equation (2) is derived from the following equation (3), and $FC_i$ of the equation (2) is derived from the following equation (4):

$$NC_i = a_1 w_i + a_2 v_i \quad (3)$$

where $a_1$ and $a_2$ are predetermined parameters and are able to be adjusted. $w_i$ is inversely proportional to the signal activity of the node $N_i$. $v_i$ is inversely proportional to the logical depth of the node N1.

$$FC_i = b_1 y_i \quad (4)$$

where $b_1$ is a predetermined parameter and are able to be adjusted. $y_i$ is inversely proportional to the slack of the flip-flops corresponding to the node $N_i$.

For illustration, there is no primary output in the circuit 200. Accordingly, the term $d(N_i, PO_l)$ of the equation (2) is equal to 0. In some embodiments, the above mentioned distances are Manhattan distances, but the present disclosure is not limited thereto.

In operation 541, after all weighting values corresponding to the nodes N1-N10 are calculated, the matrix M3 is generated according to the weighting values and the matrix M2. Then, the processor 110 selects at least one node according to the matrix M2 and the matrix M3. The operations for selecting the at least one node and the operations for following operations are similar to the above-mentioned embodiments, and accordingly the repetitious descriptions are not given herein.

The above description of the method 500 includes exemplary operations, but the operations of the method 500 are not necessarily performed in the order described. The order of the operations of the method 500 disclosed in the present disclosure are able to be changed, or the operations are able to be executed simultaneously or partially simultaneously as appropriate, in accordance with the spirit and scope of some embodiments of the present disclosure.

For illustration, in some other embodiments, the node effect cone matrix M4 of other circuit is shown below. The method of generating the matrix M4 is similar to the method of generating the matrix M2. Accordingly, it is not described herein again.

$$\begin{matrix} N1 \\ N2 \\ N3 \\ N4 \\ N5 \\ N6 \\ N7 \\ N8 \\ N9 \\ N10 \end{matrix} \begin{bmatrix} FF1 & \\ FF1 & \\ FF1 & \\ FF1 & FF3 \\ FF2 & \\ FF2 & \\ FF2 & \\ FF2 & \\ FF2 & \\ FF2 & FF3 \end{bmatrix} \quad (M4)$$

A cost matrix M5 of the other circuit is shown below. The matrix M5 is similar to the above-mentioned matrix M3. In some embodiments, weighting values in the matrix M5 are calculated by the above-mentioned equation (2).

$$\begin{matrix} N1 \\ N2 \\ N3 \\ N4 \\ N5 \\ N6 \\ N7 \\ N8 \\ N9 \\ N10 \end{matrix} \begin{bmatrix} 2 \\ 1 \\ 2 \\ 1 \\ 1 \\ 2 \\ 3 \\ 2 \\ 2 \\ 3 \end{bmatrix} \quad (M5)$$

For illustration, the dynamic set X is initialed to include all flip-flops FF1-FF3. According to the above-mentioned equation (1), the ratio R(N7) is determined to be 3. The ratios R(N1), R(N3), R(N6), R(N8), and R(N9) are determined to be 2. The ratio R(N10) is determined to be 3/2. The ratios R(N2) and R(N5) are determined to be 1. The ratio R(N4) is determined to be 1/2. As the ratio R(N4) is minimum, the node N4 is selected.

Then, the dynamic set X and the dynamic set F are adjusted according to the selected node N4. The dynamic set X is adjusted to exclude the flip-flips FF1 and FF3 corresponding to the selected node N4. In other words, the adjusted dynamic set X includes only the flip-flop FF2. It is able to be expressed as follows: X: {FF1, FF2, FF3}→{FF2}. The dynamic set F is adjusted to include the selected node N4.

Then, the ratios R(N1)-R(N10) are obtained according to the adjusted dynamic set X. Correspondingly, the new ratios R(N1)-R(N4) are determined to be infinity. The new ratios R(N7) and R(N10) are determined to be 3. The new ratios R(N6), R(N8) and R(N9) are determined to be 2. The new ratio R(N5) is determined to be 1. As the new ratio R(N5) is minimum among the new ratios R(N1)-R(N10), the node N5 is selected.

The dynamic set X and the dynamic set F are adjusted again according to the selected node N5. For example, the dynamic set X is adjusted to exclude the flip-flop FF2 corresponding to the selected node N5. In addition, the dynamic set F is adjusted to further include the selected node N5. It is able to be expressed as: F:{N4}→{N4,N5}. As a result, the adjusted dynamic set X is empty, and the dynamic set F includes the selected nodes N4 and N5. Then, the processor 110 generates a fault list according to the dynamic set F. The fault list thus includes the selected nodes N4 and N5.

With the operations discussed above, the fault list is obtained by an efficient technique and only some node(s) of the nodes N1-N10 are selected. Accordingly, a minimum number of nodes are selected for fault injection, to cover a maximum number of state elements (for example, flip-flops). As a result, time for verifying the circuit 200 can be saved.

Figure 7:
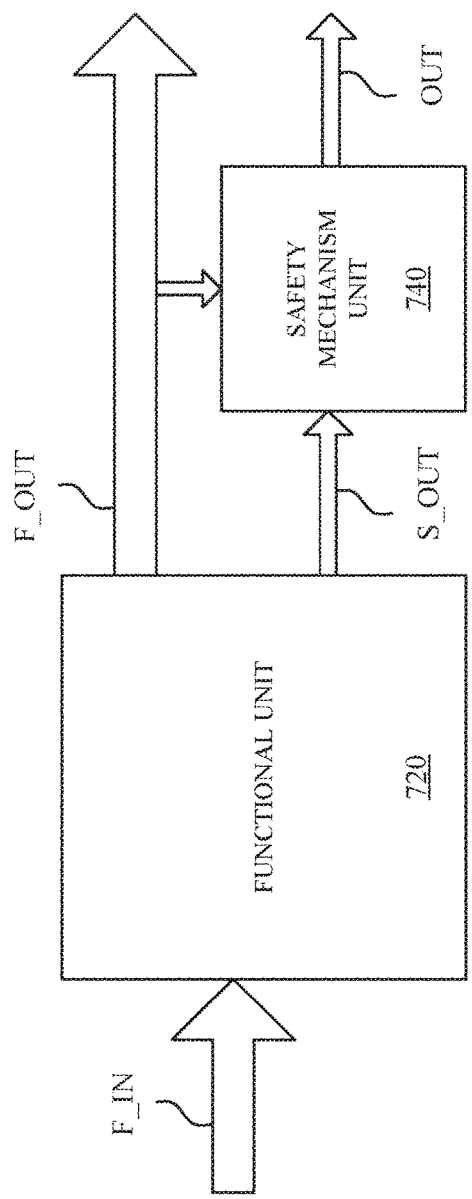
FIG. 7 is a schematic diagram illustrating a circuit configured to be verified by the system in FIG. 1, in accordance with some embodiments of the present disclosure.

Reference is now made to FIG. 7. FIG. 7 is a schematic diagram illustrating a circuit 700 configured to be verified by the system 100 in FIG. 1, in accordance with some embodiments of the present disclosure. In order to facilitate the illustration of a method 900 shown in FIG. 9 below, various terms or components regarding safety verifications for an integrated circuit are introduced with reference to FIG. 7.

For illustration, the circuit 700 includes a functional unit 720 and a safety mechanism unit 740. In some embodiments, the functional unit 720 is implemented with the circuit 200, but the present disclosure is not limited thereto. The functional unit 720 is coupled to the safety mechanism unit 740. The safety mechanism unit 740 is configured to detect a failure in the functional unit 720.

As illustratively shown in FIG. 7, the safety mechanism unit 740 is outside the functional unit 720. Accordingly, the safety mechanism unit 740 is referred to an external safety mechanism unit. In some other embodiments, the safety mechanism unit 740 is inside the functional unit 720. In these embodiments, the safety mechanism unit 740 is referred to an internal safety mechanism unit.

As illustratively shown in FIG. 7, the functional unit 720 is configured to receive input values F_IN and generate output values F_OUT according to the input values F_IN. In addition, the functional unit 720 outputs output values S_OUT to the safety mechanism unit 740 according to the input values F_IN. The safety mechanism unit 740 generates output values OUT according to the output values F_OUT and S_OUT.

The configurations of the circuit 700 are given for illustrative purposes only. Various configurations of the circuit 700 are within the contemplated scope of the present disclosure.

In some embodiments, the processor 110 performs a fault injection on the functional unit 720. In other words, the processor 110 virtually injects one or more faults to the selected nodes in a fault list. Then, the processor 110 performs a circuit simulation of the circuit 700 with the faults. The processor 110 further checks the output values OUT, to determine whether or not the fault injected to the functional unit 720 is detected.

In some embodiments, if a fault, which is injected to the functional unit 720, causes a change to the output values F_OUT, the fault is referred to a dangerous fault. Correspondingly, if a fault, which is injected to the functional unit 720, causes no change to the output values F_OUT, the fault is referred to a safe fault.

In addition, if a fault, which is injected to the functional unit 720, causes a change to the output values OUT, the fault is referred to a detected fault. Correspondingly, if a fault, which is injected to the functional unit 720, causes no change to the output values OUT, the fault is referred to an undetected fault.

In some embodiments, a same design with different safety mechanism units (SM-DSM) is implemented with a same functional unit operating with different safety mechanism units. In some other embodiments, different designs with a same safety mechanism unit (DD-SSM) are implemented with different functional units operating with the same safety mechanism unit. In some other embodiments, different designs with different safety mechanism units (DD-DSM) are implemented with different functional units operating with different safety mechanism units.

Figure 8:
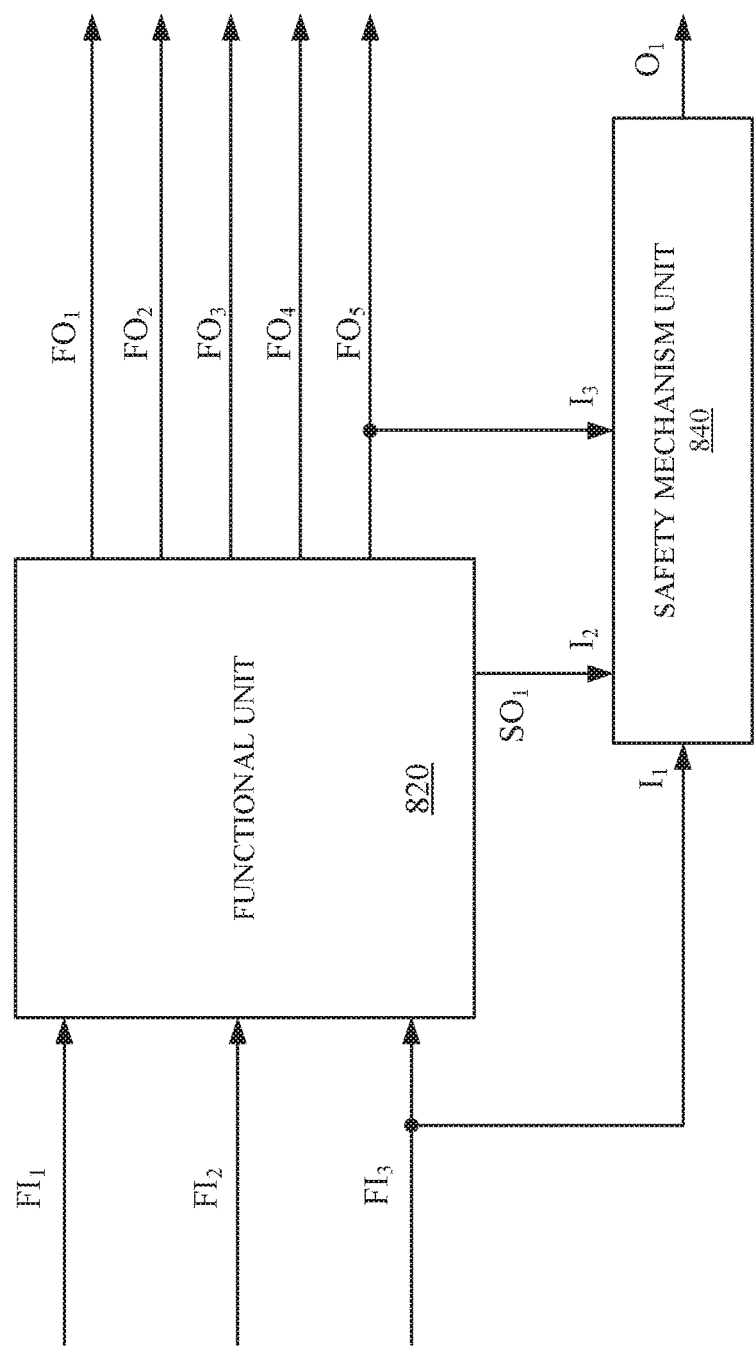
FIG. 8 is a block diagram illustrating the circuit in FIG. 7, in accordance with some embodiments of the present disclosure.

Reference is now made to FIG. 8. FIG. 8 is a block diagram illustrating a circuit 800, in accordance with some embodiments of the present disclosure. In some embodiments, the circuit 700 in FIG. 7 is implemented with a circuit 800 in FIG. 8. As illustratively shown in FIG. 8, the circuit 800 includes a functional unit 820 and a safety mechanism unit 840. The functional unit 820 is coupled to the safety mechanism unit 840. For illustration, the functional unit 820 includes three input pins $FI_1$-$FI_3$ and six output pins $FO_1$-$FO_5$ and $SO_1$. The input pin $FI_3$ is configured to be an input pin $I_i$ of the safety mechanism unit 840. The output pins $FO_5$ and $SO_1$ are configured to be two input pins $I_2$-$I_3$ of the safety mechanism unit 840.

Explained in a different way, the functional unit 820 is configured to receive input values at the input pins $FI_1$-$FI_3$. The functional unit 820 generates output values at the output pins $FO_1$-$FO_5$ and $SO_1$ according to the input values at the input pins $FI_1$-$FI_3$. In addition, the input value at the input pin $FI_3$ is transmitted to the safety mechanism unit 840 to be as an input value at the input pin $I_i$. The output value at the output pin $SO_1$ is transmitted to the safety mechanism unit 840 to be as an input value at the input pin $I_2$. The output value at the output pin $FO_5$ is transmitted to the safety mechanism unit 840 to be as an input value at the input pin $I_3$. Accordingly, the safety mechanism unit 840 generates an output value at an output pin $O_1$ according to the input values at the input pins $I_1$-$I_3$.

The configurations of the circuit 800 are given for illustrative purposes only. Various configurations of the circuit 800 are within the contemplated scope of the present disclosure.

Figure 9:
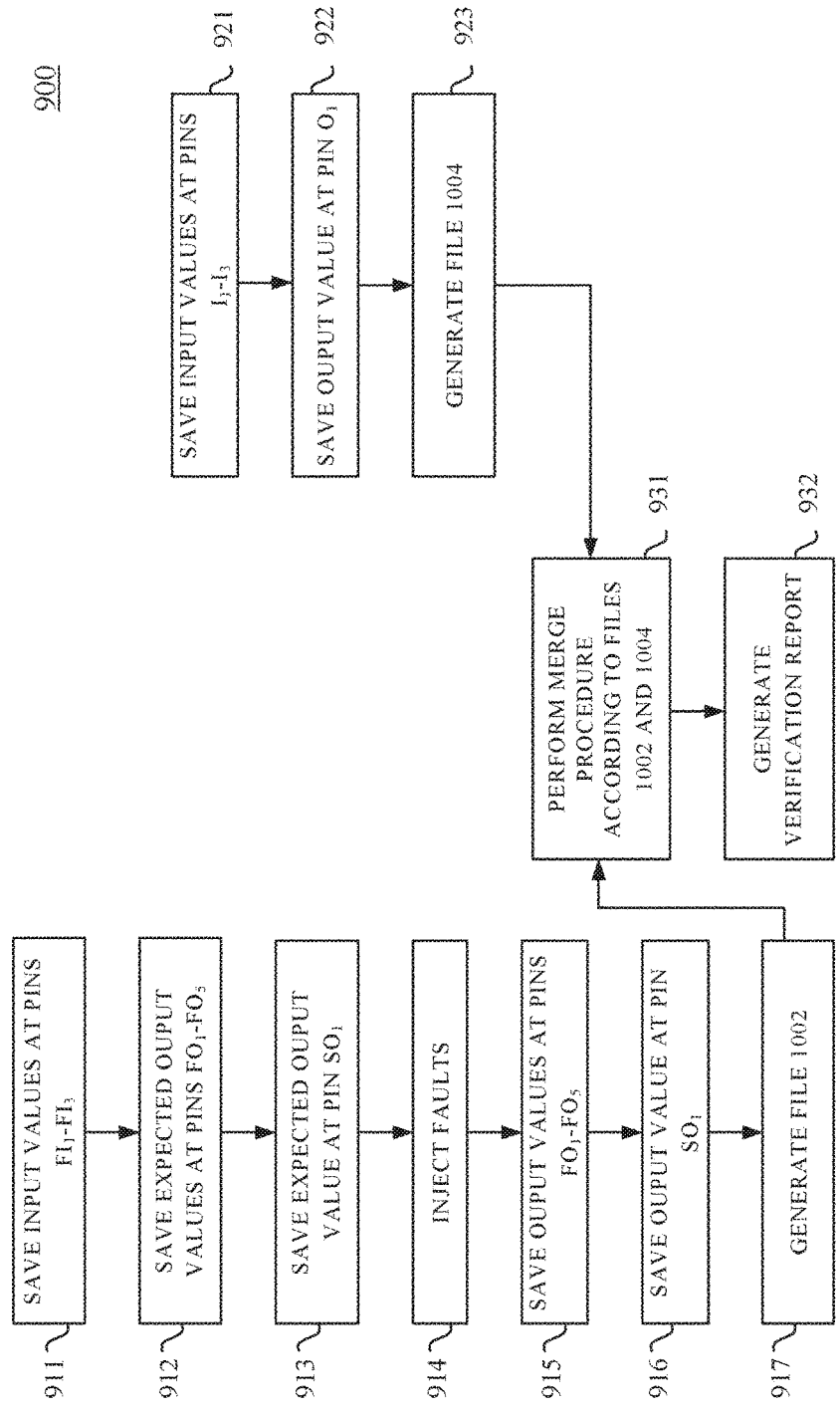
FIG. 9 is a flow chart of a method illustrating operations of the system in FIG. 1, in accordance with some embodiments of the present disclosure.
Figure 10:
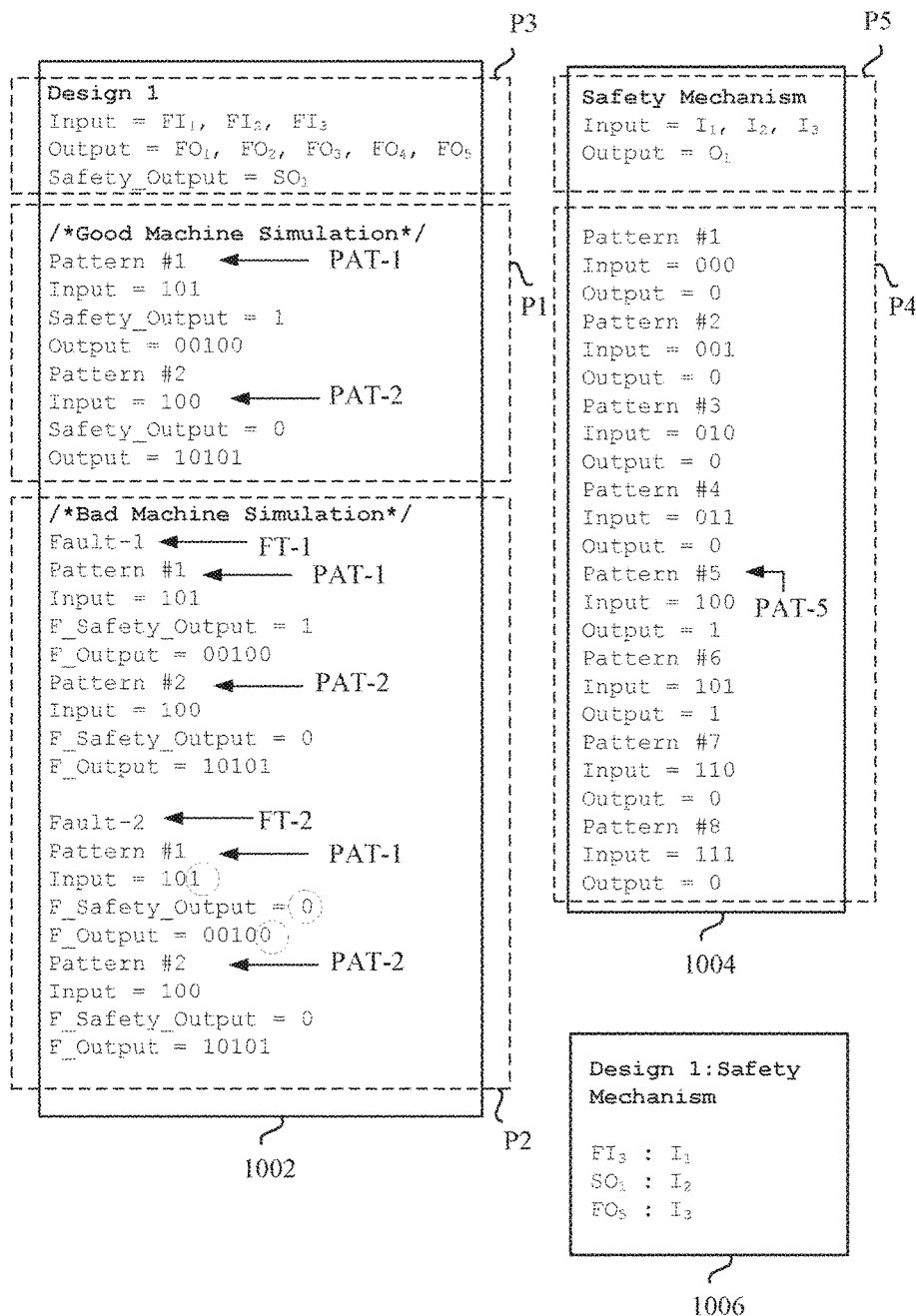
FIG. 10 is a schematic diagram illustrating a design file, a safety mechanism file, and a mapping file associated with the circuit in FIG. 8, in accordance with some embodiments of the present disclosure.

Reference is now made to FIG. 9 and FIG. 10. FIG. 9 is a flow chart of a method 900 illustrating operations of the system 100 in FIG. 1, in accordance with some embodiments of the present disclosure. FIG. 10 is a schematic diagram illustrating a design file 1002, a safety mechanism file 1004, and a mapping file 1006 associated with the circuit 800 in FIG. 8, in accordance with some embodiments of the present disclosure. For ease of understanding, the method 900 is discussed with reference to the system 100 shown in FIG. 1, the circuit 800 shown in FIG. 8, the design file 1002, the safety mechanism file 1004, and the mapping file 1006 shown in FIG. 10, but the present disclosure is not limited thereto.

In some embodiments, the functional unit 820 is analyzed according to a netlist of the circuit 800 and a corresponding fault list, to generate the design file 1002. In some embodiments, the processor 110 simulates circuit behaviors of the functional unit 820, to generate a portion P1 of the design file 1002. In addition, the processor 110 simulates circuit behaviors of the functional unit 820 according to the corresponding fault list, to generate a portion P2 of the design file 1002. Then, the processor 110 combines the portion P1 and the portion P2, to generate the design file 1002. In some embodiments, the procedure of analyzing the functional unit 820 is corresponding to operations 911-917 in FIG. 9, but the present disclosure is not limited thereto.

In operation 911, the processor 110 runs a simulation to the functional unit 820 according to different fault-free patterns and saves input values Input at the input pins $FI_1$-$FI_3$. In some embodiments, the term "fault-free" indicates that a signal pattern is designed to test circuits under a normal operating environment, or is designed to test circuits without fault injection. As illustratively shown in FIG. 10, the input values Input of corresponding fault-free patterns are saved. For illustration, in the portion P1, the input values Input of a pattern PAT-1 are bits 101, and the input values Input of a pattern PAT-2 are bits 100. For bits 101, a rightmost bit "1" is the input value at the input pin $FI_3$, the middle bit "0" is the input value at the input pin $FI_2$, and the leftmost bit "1" is the input value at the input pin $FI_1$. The configurations of the bits 101 with the input pins $FI_1$-$FI_3$ are applied to the bits 100 as well.

In operation 912, the processor 110 saves the expected output values Output at the output pins $FO_1$-$FO_5$ of corresponding fault-free patterns. For illustration, in the portion P1, the expected output values Output of the pattern PAT-1 are bits 00100, and the expected output values Output of the pattern PAT-2 are bits 10101. For bits 00100, a rightmost bit "1" is the output value at the output pin $FO_5$, the bit "0" next to the rightmost bit is the output value at the output pin $FO_4$, and so on. The configurations of the bits 00100 with the output pins $FO_1$-$FO_5$ are applied to the bits 10101 as well.

In operation 913, the processor 110 saves the expected output value Safety_Out at the output pin $SO_1$ of corresponding fault-free patterns. For illustration, in the portion P1, the output value Safety_Out of the pattern PAT-1 is 1. The output value Safety_Out of the pattern PAT-2 is 0.

In operation 914, the processor 110 injects faults to the functional unit 820 according to a fault list. In some embodiments, the fault list includes one or more faults. For illustration, the fault list includes faults FT-1 and FT-2. In some embodiments, each one of the faults is corresponding to a selected node of the functional unit 820. The processor 110 injects faults to the selected nodes of the functional unit 820 according to the fault list.

In operation 915, the processor 110 runs a simulation to the functional unit 820 with the injected faults and saves the output values F_Output at the output pins $FO_1$-$FO_5$ of corresponding patterns. For illustration, in the portion P2, the output values F_Output of the pattern PAT-1 of the fault FT-1 are bits 00100, the output values F_Output of the pattern PAT-2 of the fault FT-1 are bits 10101, the output values F_Output of the pattern PAT-1 of the fault FT-2 are bits 00100, and the output values F_Output of the pattern PAT-2 of the fault FT-2 are bits 10101. For bits 00100, a rightmost bit "0" is the output value at the output pin $FO_5$, and the bit "0" next to the rightmost bit is the output value at the output pin $FO_4$, and so on. The configurations of the bits 00100 with the output pins $FO_1$-$FO_5$ are applied to the bits 10101 as well.

In operation 916, the processor 110 saves the output value F Safety_Output at the output pin $SO_1$ of corresponding patterns. For illustration, in the portion P2, the output value F_Safety_Output of the pattern PAT-1 of the fault FT-1 is 1, the output value F_Safety_Output of the pattern PAT-2 of the fault FT-1 is 0, the output value F_Safety_Output of the pattern PAT-1 of the fault FT-2 is 0, and the output value F_Safety_Output of the pattern PAT-2 of the fault FT-2 is 0.

In operation 917, the processor 110 generates the design file 1002 according to the portion P1, the portion P2, and the portion P3. For illustration, the processor 110 combines the portion P1 and the portion P2 to generate a functional verification result, and the functional verification result is recorded in the design file 1002. The design file 1002 further includes a design portion P3. The design portion P3 defines the input pins $FI_1$-$FI_3$, the output pins $FO_1$-$FO_5$, and the output pin $SO_1$ of the functional unit 820. In some embodiments, the design file 1002 is stored in the memory 120.

In some embodiments, the safety mechanism unit 840 is analyzed to generate the safety mechanism file 1004. The processor 110 simulates circuit behaviors of the safety mechanism unit 840 according to a netlist of the safety mechanism unit 840, to generate a portion P4 of the safety mechanism file 1004. The portion P4 is a functional verification result of the safety mechanism unit 840. In some embodiments, the procedure of analyzing the safety mechanism unit 840 is performed with operations 921-923 in FIG. 9, but it is not limited thereto. In some embodiments, a failure in the functional unit 820 is able to be detected according to the design file 1002 or a combination of the design file 1002 and the safety mechanism file 1004.

In operation 921, the processor 110 runs a simulation to the safety mechanism unit 840 according to different testing patterns and saves the input values Input at the input pins $I_1$-$I_3$ of corresponding testing patterns. For illustration, in the portion P4, the input values Input of a pattern PAT-5 are bits 100. A rightmost bit "1" is the input value at the input pin $I_3$, the middle bit "0" is the input value at the input pin $I_2$, and the leftmost bit "0" is the input value at the input pin $I_1$.

In operation 922, the processor 110 saves expected output values Output at the output pin $O_1$ of corresponding testing patterns. For illustration, in the portion P4, the output value Output of the pattern PAT-5 is 1.

In operation 922, the processor 110 generates the safety mechanism file 1004 according to the portion P4 and a design portion P5. The design portion P5 defines the input pins $I_1$-$I_3$, and the output pin $O_1$ of the safety mechanism unit 840. In some embodiments, the safety mechanism file 1004 is stored in the memory 120.

As illustratively shown in FIG. 10, the processor 110 generates the mapping file 1006 according to the netlist of the circuit 800. The mapping file 1006 defines relations between the pins of the functional unit 820 and the pins of the safety mechanism 840. For illustration, the input value at the input pin $FI_3$ of the functional unit 820 is transmitted to the input pin $I_1$ of the safety mechanism unit 840. Accordingly, the mapping file 1006 records a relationship between the input pin $FI_3$ and the input pin $I_1$. The output value at the output pin $SO_1$ of the functional unit 820 is transmitted to the input pin $I_2$ of the safety mechanism unit 840. Accordingly, the mapping file 1006 records a relationship between the input pin $SO_1$ and the input pin $I_2$. The output value at the output pin $FO_5$ of the functional unit 820 is transmitted to the input pin $I_3$ of the safety mechanism unit 840. Accordingly, the mapping file 1006 records a relationship between the input pin $FO_5$ and the input pin $I_3$. In some embodiments, the mapping file 1006 is stored in the memory 120.

In operation 931, the processor 110 performs a merge procedure according to the design file 1002, the safety mechanism file 1004, and the mapping file 1006. In operation 932, the processor 110 generates a verification report of the circuit 800 according to a merge result. The verification report is configured to recorded status of the faults FT-1 and FT-2. In some embodiments, the verification report is stored in the memory 120.

The above description of the method 900 includes exemplary operations, but the operations of the method 900 are not necessarily performed in the order described. The order of the operations of the method 900 disclosed in the present disclosure are able to be changed, or the operations are able to be executed simultaneously or partially simultaneously as appropriate, in accordance with the spirit and scope of some embodiments of the present disclosure.

Figure 11:
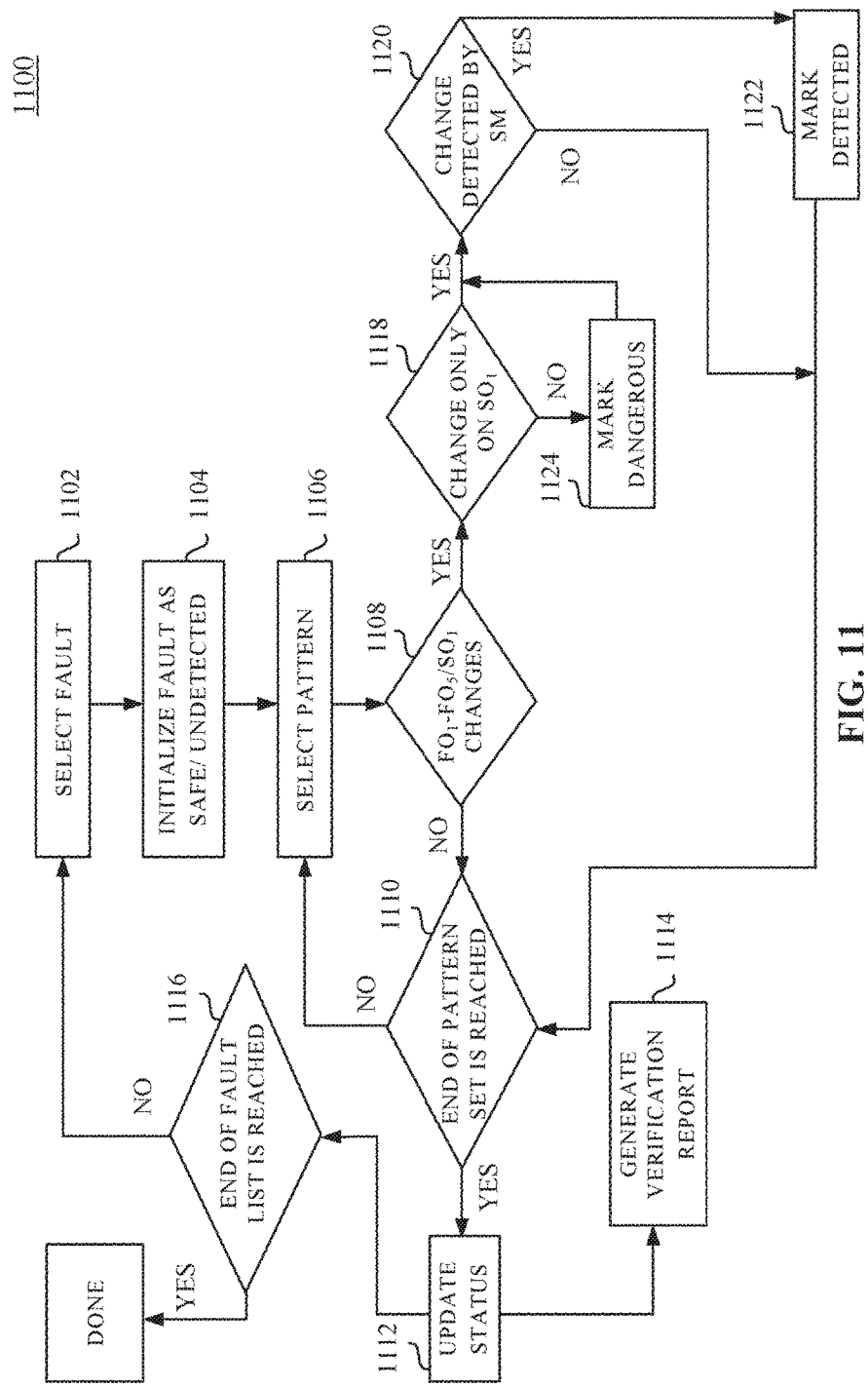
FIG. 11 is a flow chart illustrating detailed sub-operations of some operations of the method in FIG. 9, in accordance with some embodiments of the present disclosure.

Reference is now made to FIG. 11. FIG. 11 is a flow chart illustrating detailed sub-operations 1102-1124 of operations 931-932 of the method 900 in FIG. 9, in accordance with some embodiments of the present disclosure.

In sub-operation 1102, the processor 110 selects a fault in the fault list. For illustration, the design file 1002 includes the faults FT-1 and FT-2, as illustratively shown in FIG. 10. In some embodiments, the processor 110 selects the fault FT-1.

In sub-operation 1104, the processor 110 initializes the selected fault FT-1 as a safe and undetected fault. In sub-operation 1106, the processor 110 selects one of the patterns PAT-1 and PAT-2 of the fault FT-1. For illustration, the processor 110 selects the pattern PAT-1.

In sub-operation 1108, it is determined whether or not one of the output values at the output pins $FO_1$-$FO_5$ and $SO_1$ changes. In some embodiments, the processor 110 compares the portion P1 with the portion P2, to determine whether or not one of the output values at the output pins $FO_1$-$FO_5$ and $SO_1$, in the pattern PAT-1 of the fault FT-1, changes.

As illustratively shown in FIG. 10, in the pattern PAT-1 of the portion P1, the output values Output are 00100. In the pattern PAT-1 of the fault FT-1 of the portion P2, the output values F_Output are also 00100. In other words, the output values F_Output of the pattern PAT-1 of the fault FT-1 are same as the output values Output of the pattern PAT-1 of the portion P1. As a result, the processor 110 determines that the output values F_Output at the output pins $FO_1$-$FO_5$ are without change in the pattern PAT-1 of the fault FT-1.

In addition, in the pattern PAT-1 of the portion P1, the output value Safety_Output is 1. In the pattern PAT-1 of the fault FT-1 of the portion P2, the output value F_Safety_Output is also 1. In other words, the output value F_Safety_Output of the pattern PAT-1 of the fault FT-1 is same as the output value Safety_Output of the pattern PAT-1 of the portion P1. As a result, the processor 110 determines that the output value F_Safety_Output at the output pin $SO_1$ is without change in the pattern PAT-1 of the fault FT-1.

Under this condition, operation 1110 is entered. In operation 1110, it is determined whether or not an end of pattern set of the fault FT-1 is reached. As illustratively shown in FIG. 10, the fault FT-1 further includes the pattern PAT-2. Accordingly, the processor 110 determines that the end of the pattern set of the fault FT-1 has not reached yet. Under this condition, operation 1106 is entered again. The processor 110 thus selects the pattern PAT-2 of the fault FT-1. Correspondingly, the processor 110 determines that the output values F_Output at the output pins $FO_1$-$FO_5$ are without change in the pattern PAT-2 of the fault FT-1, and the output value F_Safety_Output at the output pin $SO_1$ is without change in the pattern PAT-2 of the fault FT-1. As all of the patterns PAT-1 and PAT-2 of the fault FT-1 are checked, the end of the pattern set of the fault FT-1 is reached. Under this condition, operation 1112 is entered.

In sub-operation 1112, a status of the fault FT-1 is updated. For illustration, as the output values F_Output at the output pins $FO_1$-$FO_5$ are without change in all of the patterns PAT-1 and PAT-2 of the fault FT-1, the processor 110 remains the status of the fault FT-1 as the safe and undetected fault.

In sub-operation 1114, the processor 110 generates the verification report. For illustration, the status of the fault FT-1 is recorded into the verification report. In some embodiments, the verification report is stored in the memory 120.

In sub-operation 1116, on condition that the status of the fault FT-1 is updated, it is determined whether or not an end of the fault list is reached. As illustratively shown in FIG. 10, as only the fault FT-1 is checked, the processor 110 determines that the end of fault list has not reached. Under this condition, operation 1102 is entered again.

Then, the processor 110 selects the fault FT-2 and performs similar operations to the fault FT-2. As illustratively in FIG. 10, in the pattern PAT-1 of the portion P1, the output value Safety_Output is 1. In the pattern PAT-1 of the fault FT-2 of the portion P2, the output value F_Safety_Output is 0. In other words, the output value F_Safety_Output is different from the output value Safety_Output. As a result, the processor 110 determines that the output value F_Safety_Output at the output pin $SO_1$ changes in the pattern PAT-1 of the fault FT-2. Then, sub-operation 1118 is entered.

In sub-operation 1118, it is determined whether or not only the output value F_Safety_Output at the output pin $SO_1$ changes. As illustratively in FIG. 10, the output values F_Output of the pattern PAT-2 of the fault FT-2 are same as the output values Output of the pattern PAT-2 of the portion P1. Thus, the processor 110 determines that only the output value F_Safety_Output at the output pin $SO_1$ changes. Under this condition, sub-operation 1120 is entered.

In sub-operation 1120, it is determined whether the change is detected by the safety mechanism unit 840. For example, the processor 110 maps the testing patterns of the safety mechanism file 1004 to the portion P2 of the design file 1002 according to the mapping file 1006. As illustratively shown in FIG. 10, in the pattern PAT-1 of the fault FT-2 of the portion P2, the input value, which is corresponding to the input pin $FI_3$ and labeled with a circle, of the input values Input is 1. The output value F_Safety_Output at the output pin $SO_1$ is 0. The output value, which is corresponding to the output pin $FO_5$ and labeled with a circle, of the output values F_Output is 0.

Based on the mapping file 1006, the pattern PAT-1 of the fault FT-2 of the design file 1002 is corresponding to the pattern PAT-5, whose input values Input are 100, of the safety mechanism file 1004. In some embodiments, on condition that an output value Output of the pattern PAT-5 is a predetermined value, the processor 110 determines that the fault FT-2 is detected. In some embodiments, the predetermined value is 1. For example, the output value Output of the pattern PAT-5 is 1, the processor 110 determines that the fault FT-2 is detected. In some other embodiments, if the output value Output of the pattern PAT-5 is 0, the processor 110 determines that the fault FT-2 is undetected.

In sub-operation 1122, the processor 110 marks the fault FT-2 as a safe and detected fault. The status of the fault FT-2 is updated and is recorded into the verification report.

Figure 12:
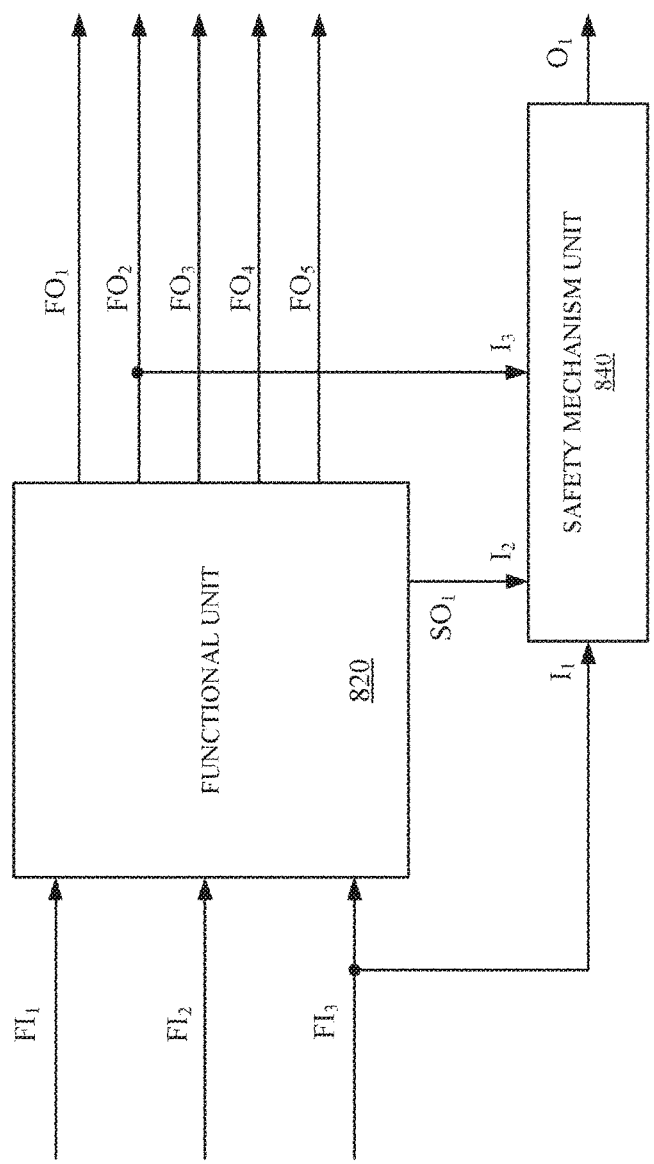
FIG. 12 is a block diagram illustrating the circuit in FIG. 7, in accordance with some embodiments of the present disclosure.
Figure 13:
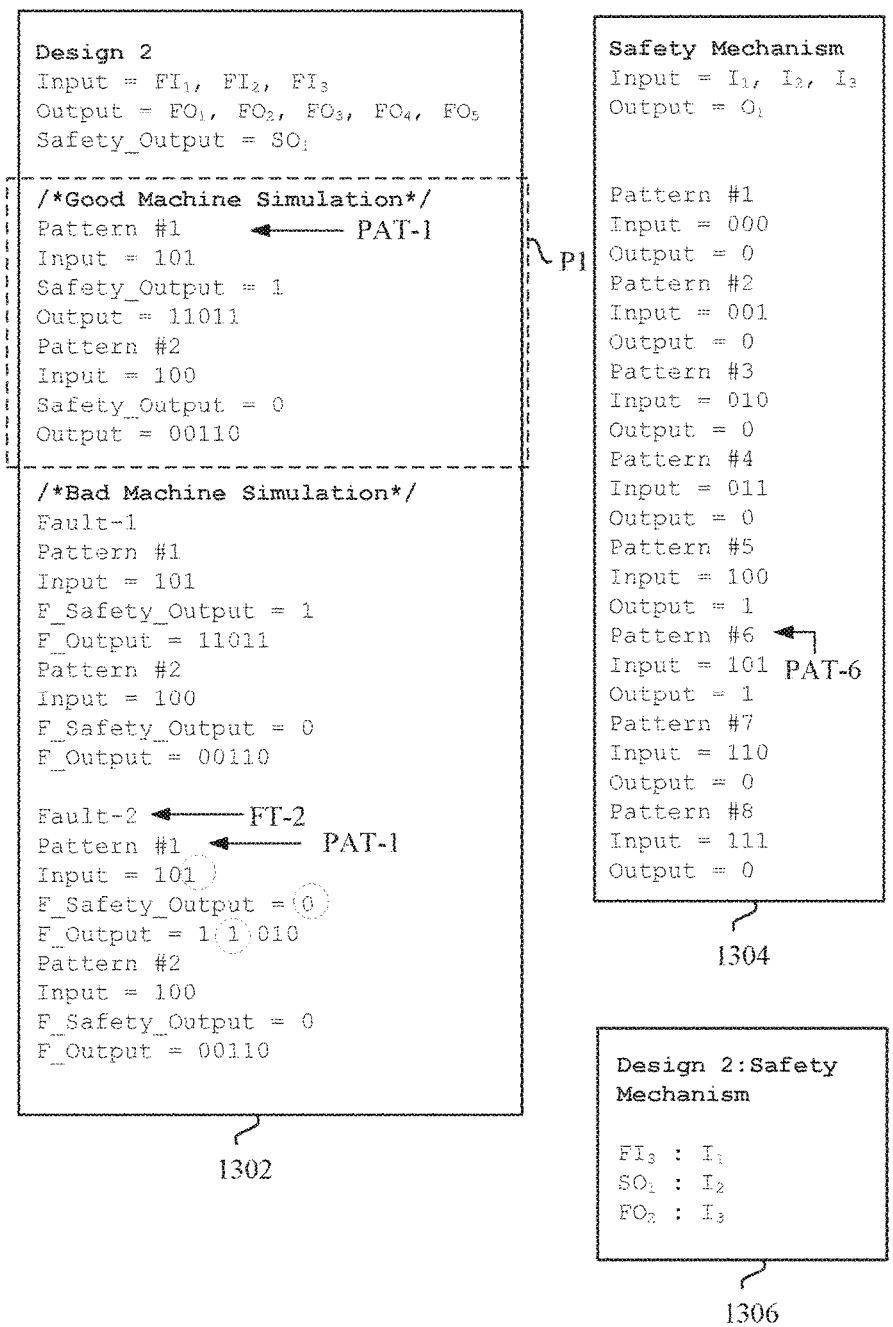
FIG. 13 is a schematic diagram illustrating a design file, a safety mechanism file, and a mapping file associated with the circuit in FIG. 12, in accordance with some embodiments of the present disclosure.

Reference is now made to FIG. 12 and FIG. 13. FIG. 12 is a block diagram illustrating the circuit 1200, in accordance with some embodiments of the present disclosure. FIG. 13 is a schematic diagram illustrating a design file 1302, a safety mechanism file 1304, and a mapping file 1306 associated with the circuit 1200 in FIG. 12, in accordance with some embodiments of the present disclosure. In some embodiments, the circuit 700 in FIG. 7 is implemented with the circuit 1200 in FIG. 12. For ease of understanding, with respect to the embodiments of FIG. 8, like elements in FIG. 12 are designated with the same reference numbers.

For illustration, a difference between the circuit 1200 and the circuit 800 is that the input pin $I_3$ of the safety mechanism unit 840 in FIG. 12 is coupled to the output pin $FO_2$ of the functional unit 820.

As illustratively shown in FIG. 13, in the pattern PAT-1 of the fault FT-2, output values F_Output are 11010. Expected output values Output of the pattern PAT-1 of the portion P1 are 11011. In other words, the output values F_Output in the pattern PAT-1 of the fault FT-2 are different from the output values Output in the pattern PAT-1 of the portion P1. Thus, the processor 110 determines that the fault FT-2 is a dangerous fault in sub-operation 1124.

In addition, the values, labeled with circles, of the pattern PAT-1 of the fault FT-2 of the design file 1302 are 1, 0, and 1. Input values Input of a pattern PAT-6 of the safety mechanism unit 1304 are the values 101. Accordingly, the pattern PAT-1 of the fault FT-2 is corresponding to the pattern PAT-6 of the safety mechanism file 1304. As illustratively shown in FIG. 13, the output value Output of the pattern PAT-6 is 1. Thus, the processor 110 determines that the fault FT-2 is detected. Then, the processor 110 marks the fault FT-2 as a dangerous and detected fault. The status of the fault FT-2 is updated and is recorded into the verification report.

With the operations discussed above, the functional unit 820 and the safety mechanism unit 840 are verified separately. Thus, simulation time for the functional unit 820 in coordination with the safety mechanism unit 840 can be reduced.

In some embodiments, the memory 120 is configured to store safety mechanism files of different safety mechanism units. These different safety mechanism units are simulated once, and the safety mechanism files are stored in the memory 120 to form a reusable safety mechanism library. These safety mechanism files are able to be reused for different functional units.

In some embodiments, the processor 110 selects a safety mechanism file, which corresponds to a safety mechanism unit being suitable for verifying the functional unit 820, from the reusable safety mechanism library. Thus, the processor 110 verifies the functional unit 820 by merging the selected safety mechanism file and the design file corresponding to the functional unit 820 without actual integration.

In some embodiments, if a circuit design of the functional unit 820 changes, only the design file 1002 or the mapping file 1006 needs to be updated. Time for re-verification of the whole system is saved.

In some embodiments, a method is disclosed that includes the operations below. A netlist of a circuit is transformed to a first matrix. The netlist includes information associated with nodes and flip-flops of the circuit. A first node is selected from the nodes according to the first matrix and a second matrix, in order to generate a fault list. The second matrix includes weighting values for the nodes. The first node is determined to be associated with a maximum number of the flip-flops. A fault injection is performed on the circuit according to the fault list, in order to verify a functional safety of the circuit.

Also disclosed is a method that includes the operations below. A functional unit in a circuit is analyzed according to a netlist of the circuit and a fault list, in order to generate a first file. The first file includes a first functional verification result. A safety mechanism is analyzed according to a netlist of the safety mechanism unit, in order to generate a second file. The second file includes a second functional verification result. A failure in the functional unit is detected according to the first file or a combination of the first file and the second file.

Also disclosed is a system that includes a memory and a processor. The memory is configured to store computer program codes. The processor is configured to execute the computer program codes in the memory to perform operations below. A netlist of a functional unit in a circuit is transformed to a first matrix. The netlist includes information associated with nodes and flip-flops of the functional unit. A first node is selected from the nodes according to the first matrix and a second matrix, in order to generate a fault list. The second matrix includes weighting values for the nodes. The first node is determined to be associated with a maximum number of the flip-flops. A fault injection is performed on the functional unit according to the fault list. The functional unit is analyzed according to the netlist and the fault list, in order to generate a first file. The first file includes a first functional verification result. A safety mechanism unit is analyzed according to a netlist of the safety mechanism unit, in order to generate a second file. The second file includes a second functional verification result. A failure in the functional unit is detected according to the first file or a combination of the first file and the second file.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    transforming a netlist of a circuit to a first matrix, wherein the netlist comprises information associated with nodes and flip-flops of the circuit;
    selecting a first node from the nodes according to the first matrix and a second matrix, in order to generate a fault list, wherein the second matrix comprises weighting values for the nodes, and the first node is determined to be associated with a maximum number of the flip-flops; and
    performing a fault injection on the circuit according to the fault list, in order to verify a functional safety of the circuit.

2. The method of claim 1, wherein transforming the netlist of the circuit to the first matrix comprises:
    assigning the flip-flops to rows of the first matrix according to the nodes,
    wherein the nodes correspond to output terminals of logic gates of the circuit, and at least one input terminal of at least one flip-flop, which is assigned to a first row of the rows, of the flip-flops is associated with the first node of the nodes.

3. The method of claim 1, wherein the weighting values of the second matrix are assigned to be a predetermined value.

4. The method of claim 1, further comprising:
    generating the weighting values according to the netlist, in order to generate the second matrix.

5. The method of claim 4, wherein generating the weighting values according to the netlist comprises:
according to the netlist of the circuit, estimating first features corresponding to the first node and second features corresponding to at least one flip-flop associated with the first node; and
determining a first weighting value, which corresponds to the first node, of the weighting values according to the first features and the second features.

6. The method of claim 1, wherein selecting the first node from the nodes according to the first matrix and the second matrix comprises:
recursively calculating a ratio of an output of a first function to an output of a second function, in order to select the first node from the nodes;
wherein the first function is associated with the second matrix, the second function is associated with the first matrix, and the first node is selected on condition that the ratio, which corresponds to the first node, is minimum; and
recording the first node into the fault list.

7. The method of claim 6, wherein recursively calculating the ratio comprises:
selecting one node from the nodes;
obtaining the output of the first function corresponding to the one node according to the second matrix, wherein the output of the first function corresponding to the one node is a corresponding weighting value of the weighting values;
obtaining the output of the second function corresponding to the one node according to the first matrix, wherein the output of the second function is a number that is determined according to an intersection of a dynamic set and at least one corresponding flip-flop in the first matrix;
determining the ratio of the output of the first function to the output of the second function, wherein the dynamic set is adjusted according to the at least one corresponding flip-flop after the ratio is determined; and
stop determining the ratio on condition that the dynamic set is adjusted to be empty.

8. A method, comprising:
analyzing a functional unit in a circuit according to a netlist of the circuit and a fault list, in order to generate a first file that comprises a first functional verification result, wherein analyzing the functional unit in the circuit comprises:
simulating first circuit behaviors of the functional unit according to the netlist to generate a first portion of the first functional verification result;
simulating second circuit behaviors of the functional unit according to the netlist and the fault list to generate a second portion of the first functional verification result; and
generating the first file according to the first portion of the first functional verification result and the second portion of the first functional verification result;
analyzing a safety mechanism unit according to a netlist of the safety mechanism unit, in order to generate a second file that comprises a second functional verification result; and
detecting a failure in the functional unit according to the first file or a combination of the first file and the second file.

9. The method of claim 8, wherein simulating the first circuit behaviors comprises:
saving input values of at least one input pin of input pins of the functional unit;
saving first expected output values of at least one output pin of output pins of the functional unit according to a fault-free pattern;
saving second expected output values of at least one safety pin of the functional unit according to the fault-free pattern; and
generating the first portion of the first functional verification result according to the input values, the first expected output values, and the second expected output values.

10. The method of claim 9, wherein simulating second circuit behaviors comprises:
saving first output values of the at least one output pin after a fault injection is performed according to the fault list;
saving second output values of the at least one safety pin after the fault injection is performed; and
generating the second portion of the first functional verification result according to the fault injection, the first output values, and the second output values.

11. The method of claim 8, further comprising:
comparing the second portion of the first functional verification result with the first portion of the first functional verification result, in order to detect the failure,
wherein the failure is detected as a dangerous fault on condition that the second portion of the first functional verification result is different from the first portion of the first functional verification result.

12. The method of claim 8, wherein analyzing the safety mechanism unit comprises:
simulating third circuit behaviors of the safety mechanism unit according to the netlist and testing patterns to generate the second functional verification result.

13. The method of claim 12, wherein simulating the third circuit behaviors comprises:
saving input values of at least one input pin of the safety mechanism unit according to the testing patterns;
saving output values of at least one output pin of the safety mechanism unit according to the third circuit behaviors; and
generating the second functional verification result according to the input values and the output values.

14. The method of claim 13, wherein detecting the failure comprises:
mapping a first testing pattern of the testing patterns to the second portion of the first functional verification result according to relations between pins of the functional unit and pins of the safety mechanism unit,
wherein the failure is determined to be a detected fault on condition that one, which corresponds to the first testing pattern, of the output values has a predetermined value.

15. A system, comprising:
a memory configured to store computer program codes; and
a processor configured to execute the computer program codes in the memory to:
transform a netlist of a functional unit in a circuit to a first matrix, wherein the netlist comprises information associated with nodes and flip-flops of the functional unit;
select a first node from the nodes according to the first matrix and a second matrix, in order to generate a fault list, wherein the second matrix comprises weighting values for the nodes, and the first node is determined to be associated with a maximum number of the flip-flops;

perform a fault injection on the functional unit according to the fault list;

analyze the functional unit according to the netlist and the fault list, in order to generate a first file that comprises a first functional verification result;

analyze a safety mechanism unit according to a netlist of the safety mechanism unit, in order to generate a second file that comprises a second functional verification result; and detect a failure in the functional unit according to the first file or a combination of the first file and the second file.

16. The system of claim 15, wherein the memory is coupled to the processor and configured to store one of the fault list, the first file, and the second file.

17. The system of claim 15, wherein to select the first node from the nodes according to the first matrix and the second matrix comprises:

recursively calculating a ratio of an output of a first function to an output of a second function, in order to select the first node from the nodes, wherein the first function is associated with the second matrix, the second function is associated with the first matrix, and the first node is selected on condition that the ratio, which corresponds to the first node, is minimum; and recording the first node into the fault list.

18. The system of claim 17, wherein recursively calculating the ratio comprises:

selecting one node from the nodes;

obtaining the output of the first function corresponding to the one node according to the second matrix, wherein the output of the first function corresponding to the one node is a corresponding weighting value of the weighting values;

obtaining the output of the second function corresponding to the one node according to the first matrix, wherein the output of the second function is a number that is determined according to an intersection of a dynamic set and at least one corresponding flip-flop in the first matrix;

determining the ratio of the output of the first function to the output of the second function, wherein the dynamic set is adjusted according to the at least one corresponding flip-flop after the ratio is determined; and stopping determining the ratio on condition that the dynamic set is adjusted to be empty.

19. The system of claim 15, wherein the processor is further configured to execute the computer program codes in the memory to:

map a testing pattern of the second file to the first file according to relations between pins of the functional unit and pins of the safety mechanism unit, to determine whether the failure is a detected fault or not.

20. The system of claim 15, wherein to transform the netlist of functional unit in the circuit to the first matrix comprises:

assigning the flip-flops to rows of the first matrix according to the nodes, wherein the nodes correspond to output terminals of logic gates of the circuit, and at least one input terminal of at least one flip-flop is associated with the first node of the nodes.

* * * * *